(12) United States Patent
Kuramata et al.

(10) Patent No.: US 6,984,840 B2
(45) Date of Patent: *Jan. 10, 2006

(54) OPTICAL SEMICONDUCTOR DEVICE HAVING AN EPITAXIAL LAYER OF III-V COMPOUND SEMICONDUCTOR MATERIAL CONTAINING N AS A GROUP V ELEMENT

(75) Inventors: Akito Kuramata, Kawasaki (JP); Shinichi Kubota, Kawasaki (JP); Kazuhiko Horino, Kawasaki (JP); Reiko Soejima, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/313,764

(22) Filed: May 18, 1999

(65) Prior Publication Data

US 2002/0110945 A1   Aug. 15, 2002

(30) Foreign Application Priority Data

May 18, 1998 (JP) ................. 10-135425
Dec. 11, 1998 (JP) ................. 10-353241

(51) Int. Cl.
    *H01L 29/06* (2006.01)
(52) U.S. Cl. .............................. 257/11; 257/77; 257/79
(58) Field of Classification Search ................. 257/190, 257/77, 96, 103, 11, 79; 438/478; 117/89
    See application file for complete search history.

(56) References Cited

U.S. PATENT DOCUMENTS

| 5,393,993 A | * | 2/1995 | Edmond et al. ............... 257/77 |
| 5,670,798 A | * | 9/1997 | Schetzina ..................... 257/96 |
| 5,727,008 A |   | 3/1998 | Koga ........................... 372/43 |
| 5,739,554 A | * | 4/1998 | Edmond et al. ............. 257/103 |
| 5,747,832 A | * | 5/1998 | Nakamura et al. .......... 257/103 |
| 5,756,374 A |   | 5/1998 | Miura et al. .................. 438/46 |
| 5,786,606 A | * | 7/1998 | Nishio et al. ................ 257/103 |
| 5,834,325 A | * | 11/1998 | Motoki et al. ................ 438/22 |
| 5,903,017 A | * | 5/1999 | Itaya et al. .................. 257/190 |
| 6,120,600 A | * | 9/2000 | Edmond et al. ............. 117/89 |
| 6,165,874 A | * | 12/2000 | Powell et al. ................ 438/478 |
| 6,218,269 B1 | * | 4/2001 | Nikolaev et al. ........... 438/518 |

FOREIGN PATENT DOCUMENTS

| JP | 6-232451 |   | 8/1994 |
| JP | 8-97471 |   | 4/1996 |
| JP | 8-203834 | * | 8/1996 |
| JP | 8-264835 |   | 10/1996 |
| JP | 8-264836 |   | 10/1996 |
| JP | 8-306958 |   | 11/1996 |
| JP | 8-330629 |   | 12/1996 |

(Continued)

*Primary Examiner*—W. David Coleman
(74) *Attorney, Agent, or Firm*—Westerman, Hattori, Daniels & Adrian, LLP

(57) ABSTRACT

An optical semiconductor device includes an SiC substrate having an n-type conductivity, and an AlGaN buffer layer having an n-type conductivity formed on the SiC substrate with a composition represented as $Al_xGa_{1-x}N$, wherein the AlGaN buffer layer has a carrier density in the range between $3\times10^{18}$–$1\times10^{20}$ cm$^{-3}$, and the compositional parameter x is larger than 0 but smaller than 0.4 (0<x<0.4).

24 Claims, 20 Drawing Sheets

FOREIGN PATENT DOCUMENTS

| | | |
|---|---|---|
| JP | 9-83016 | 3/1997 |
| JP | 10-22526 | 1/1998 |
| JP | 10-56236 | 2/1998 |
| JP | 10-114600 | 5/1998 |
| JP | 10-117016 | 5/1998 |
| JP | 10-126006 | 5/1998 |
| JP | 10-135576 | 5/1998 |
| JP | 10-144612 | 5/1998 |

* cited by examiner

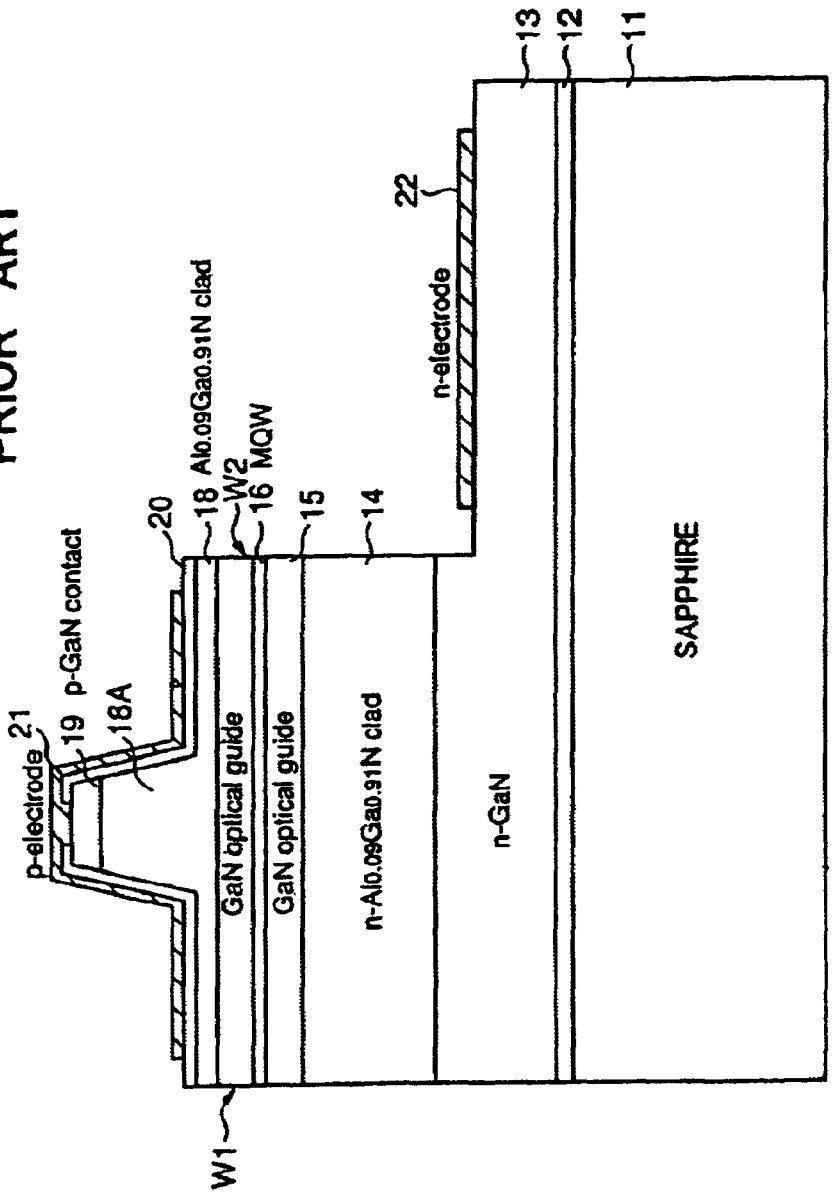

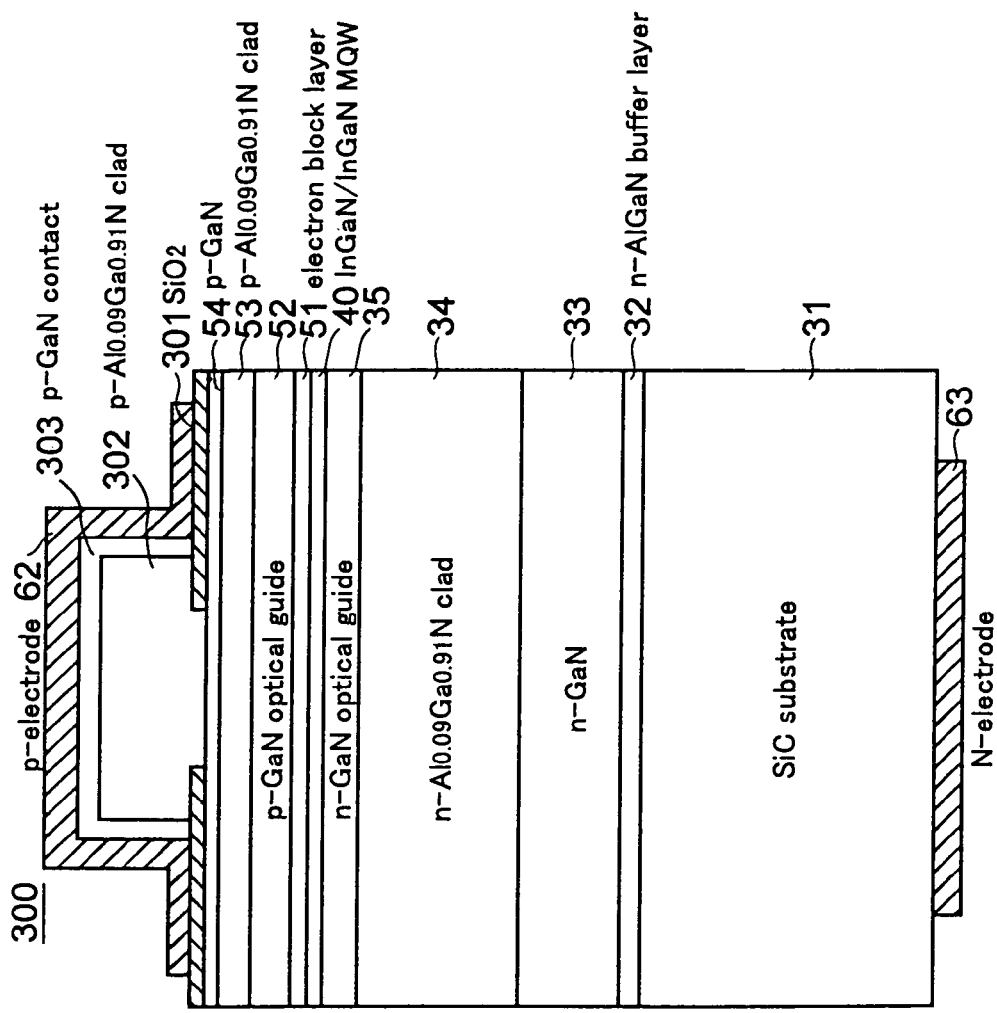

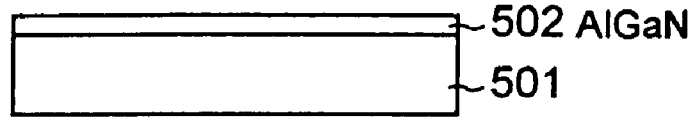
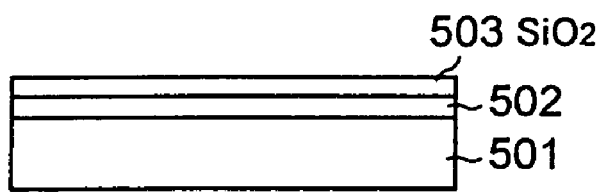
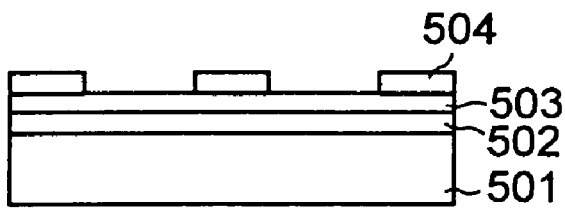
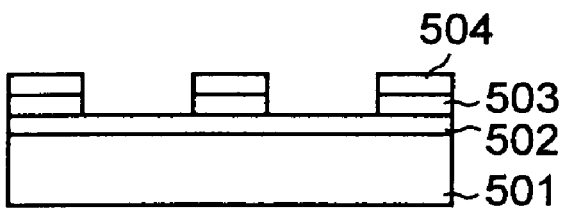
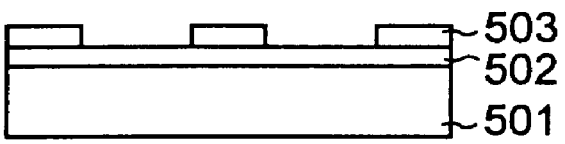
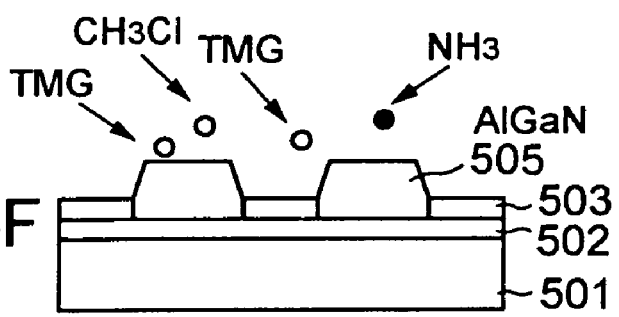

OPTICAL SEMICONDUCTOR DEVICE HAVING AN EPITAXIAL LAYER OF III-V COMPOUND SEMICONDUCTOR MATERIAL CONTAINING N AS A GROUP V ELEMENT

BACKGROUND OF THE INVENTION

The present invention generally relates to optical semiconductor devices and more particularly to a GaN-family laser diode producing blue to ultraviolet radiation and a fabrication process thereof.

Laser diodes, light-emitting diodes and photodiodes are optical semiconductor devices used extensively in the field of optical telecommunication, optical information processing, recording of information, and the like.

In the case of laser diode, there is a demand, particularly in the field of optical information recording, for a laser diode operable in the optical wavelength band of blue to ultraviolet radiation for increasing the recording density. It should be noted a laser diode oscillates generally in the optical wavelength band of red to infrared radiation. Further, there is a demand for a photodiode operable in such a short optical wavelength band.

Conventionally, GaN, having a large bandgap, has been recognized as a promising material for constructing an optical semiconductor device such as a laser diode or photodiode that operates in the foregoing blue to ultraviolet wavelength band. A light-emitting diode using a GaN crystal for the active layer thereof is already put into practical use. Further, a laser diode having a double heterostructure of GaN/InGaN/GaN is already known. By incorporating an appropriate impurity element into the GaN crystal, it is also possible to cause the laser diode to oscillate in the visible wavelength band of green radiation.

It should be noted that GaN has a Wurtzite structure belonging to the hexagonal crystal system, and the preparation of a single crystal substrate of GaN is difficult. Thus, the optical semiconductor devices that use GaN for the active layer have been constructed on the c-surface of a sapphire ($Al_2O_3$) substrate, which also belongs to the hexagonal crystal system. Thereby, the GaN active layer is grown on the foregoing c-surface of sapphire substrate epitaxially.

FIG. 1 shows the construction of a conventional GaN-family laser diode 1 operable in the optical wavelength band of blue to ultraviolet radiation.

Referring to FIG. 1, the laser diode 1 is formed on a sapphire substrate 11 and includes a GaN buffer layer 12 formed on the substrate 11, an n-type GaN electrode layer 13 formed on the GaN buffer layer 12, and a lower cladding layer 14 of n-type AlGaN formed on the electrode layer with a composition of $Al_{0.09}Ga_{0.91}N$.

On the lower cladding layer 14, there is formed an optical waveguide layer 15 of n-type GaN, and an active layer having a multiple quantum well (MQW) structure is formed on the n-type optical waveguide layer 15 epitaxially, wherein the MQW structure includes a repetitive stacking of a unit structure of undoped InGaN quantum well layer sandwiched by a pair of undoped GaN barrier layers.

The active layer 15 is covered by an optical waveguide layer 17 of p-type GaN, and an upper cladding layer 18 of p-type AlGaN is formed on the optical waveguide layer 17 with a composition of $Al_{0.09}Ga_{0.91}N$. The upper cladding layer 18 is formed with an optical waveguide ridge 18A extending in the axial direction of the laser diode at a laterally central part thereof, and a contact layer 19 of p-type GaN is formed on the top surface of the optical waveguide ridge 18A.

The upper cladding layer 18 and the GaN contact layer 19, including both side walls of the optical waveguide ridge 18A, are covered by an insulation film 20 of $SiO_2$, and a p-side electrode 21 is formed on the insulation film 20 in electrical contact with the GaN contact layer at the optical waveguide ridge 18A via a via-hole formed in the insulation film 20.

The foregoing semiconductor layers 14–18 form together a stacked layered structure defined by two vertical side walls $W_1$ and $W_2$ extending substantially vertically to the principal surface of the substrate 11. Further, there is formed an optical cavity in the stacked layered structure by a pair of mirror surfaces disposed so as to face in a direction perpendicularly to the sheet of FIG. 1.

Further, the substrate 11, buffer layer 12 and the electrode layer 13 thereon extend laterally beyond the foregoing side wall surface $W_2$, and an n-side electrode 22 is provided on the electrode layer 13. The laser diode of FIG. 1 oscillates in the optical wavelength of 390–420 nm and has an important application in the field of high-density information recording.

The laser diode of FIG. 1, however, has a drawback in that, due to the existence of large lattice misfit of as much as 13% or more at the heteroepitaxial interface between the c-surface of the sapphire single crystal substrate 11 and the GaN epitaxial layer 12, the epitaxial layers 15–17 forming the MQW structure 16 tend to include various crystal defects with a high concentration level. Further, the laser diode 1 of FIG. 1 has a difficulty, contrary to the conventional edge-emission type, in that formation of the electrode on the bottom surface of the sapphire substrate 11 is difficult. Thereby, the construction, and hence the fabrication process of the laser diode becomes inevitably complex. In addition, the sapphire substrate used in the laser diode 1 is difficult to be cleaved, and thus, it is difficult in the laser diode 1 to form the mirror surfaces by a conventional cleaving process, contrary to the conventional edge-emission type laser diode constructed on a substrate having a zinc blende structure.

In the laser diode 1 of FIG. 1, the foregoing mirror surfaces are formed by a dry etching process, while such a process of forming the mirror surface by a dry etching process takes a substantial time. Further, the quality of the mirror surfaces thus formed is inferior, in terms of flatness and angle, to the quality of the mirror surfaces formed by a cleaving process.

It is also proposed to use a conductive SiC substrate, which also belongs to the hexagonal crystal system, in place of the sapphire substrate and form the GaN-family active layer of the optical semiconductor on such an SiC substrate. For example, the Japanese Laid-Open Patent Publication 10-135575 describes a technology of growing a GaN-family active layer on the (0001)Si surface of a 6H—SiC single crystal substrate epitaxially. It should be note that use of an SiC substrate has various advantageous features such as small lattice misfit, less than 4%, between the GaN active layer and the SiC substrate, electrical conductivity of the substrate, and excellent thermal conductivity of the substrate, which is superior to that of a sapphire substrate. Thus, by using an SiC substrate, it is possible to construct a laser diode oscillating in the optical wavelength of blue to violet radiation by using a construction similar to that of a conventional edge-emission type laser diode.

In order to construct an optical semiconductor device that uses a GaN-family active layer formed on such an SiC substrate epitaxially, it is necessary to establish a technology to form a GaN buffer layer on the SiC substrate epitaxially. Unfortunately, it is known that an epitaxial growth of a GaN layer tends to lead to an island-like growth when the growth is conducted on a SiC substrate. When such an island-like growth occurs in the buffer layer, it is difficult to form the GaN-family active layer thereon with a planarized top surface. Further, the GaN-family active layer thus formed tends to incorporate therein various crystal defects, while such crystal defects impedes the interaction occurring in the active layer between GaN and photons. Thereby, the efficiency of laser oscillation is deteriorated seriously.

It is known that the problem of island-like growth of GaN film is avoided when the SiC substrate is covered by a buffer layer of AlN or AlGaN, such that the desired epitaxial growth of the GaN active layer occurs on such a buffer layer. However, it has been not possible to provide electrical conductivity to an AlN film used for the buffer layer.

When a buffer layer of AlGaN is used, on the other hand, it is possible to provide an n-type conductivity to the buffer layer, as long as the content of Al in the AlGaN buffer layer does not exceed 40%. Thus, as long as the composition of the AlGaN layer is controlled as such, it is possible to electrically interconnect the GaN active layer with the SiC substrate via the AlGaN buffer layer. On the other hand, the condition of forming the conductive AlGaN epitaxial film on a SiC substrate with a flat and smooth top surface suitable for forming an active layer of GaN thereon, has not been explored to the date.

SUMMARY OF THE INVENTION

Accordingly, it is an object of the present invention to provide a novel and useful optical semiconductor device and a fabrication process thereof wherein the foregoing problems are successfully eliminated.

Another and more specific object of the present invention is to provide an optical semiconductor device having an SiC substrate and a nitride layer of a group III element including Ga formed epitaxially on the substrate, wherein the epitaxial layer has a flat and smooth top surface and that an excellent electrical interconnection is secured between the SiC substrate and the nitride epitaxial layer.

Another object of the present invention is to provide an optical semiconductor device having a simple structure for confining the electric currents injected to the laser diode into a desired stripe region and is simultaneously capable of controlling the transverse mode oscillation in the state that laser diode produces a high-power optical output.

Another object of the present invention is to provide an optical semiconductor device having a selectively grown region of nitride and a fabrication process thereof.

Another object of the present invention is to provide an optical semiconductor device having a nitride active layer of a group III element including Ga and an electron blocking layer provided for preventing overflowing of electrons from the active layer, wherein the doping of the electron blocking layer is optimized such that crack formation is minimized, the carrier confinement in the active layer is maximized and the threshold voltage of laser oscillation is minimized.

Another object of the present invention is to provide an optical semiconductor device, comprising:

a substrate of SiC having a first conductivity type;

a buffer layer of AlGaN formed on said substrate epitaxially, said buffer layer having said first conductivity type and a composition represented as $Al_xGa_{1-x}N$;

a first cladding layer having said first conductivity type, said first cladding layer being formed on said buffer layer epitaxially;

an active layer formed epitaxially on said first cladding layer;

a second cladding layer having a second, opposite conductivity type, said second cladding layer being formed on said active layer epitaxially;

a first electrode provided so as to inject first-type carriers having a first polarity into said second cladding layer; and a second electrode provided on said substrate so as to inject second-type carriers having a second polarity, said buffer layer containing said first type carriers with a concentration level from $3\times10^{18}$ cm$^{-3}$ to $1\times10^{20}$ cm$^{-3}$ and said compositional parameter x larger than 0 but smaller than 0.4 ($0<x<0.4$).

According to the present invention, the resistance at the interface between the substrate and the buffer layer is effectively minimized.

Another object of the present invention is to provide an optical semiconductor device, comprising:

a substrate of SiC having a first conductivity type;

a buffer layer of AlGaN formed on said substrate epitaxially;

a first cladding layer of AlGaN having said first conductivity type, said first cladding layer being formed on said buffer layer epitaxially;

an optical waveguide layer of GaN having said first conductivity type, said optical waveguide layer being formed on said first cladding layer epitaxially;

an active layer formed epitaxially on said optical waveguide layer, said active layer containing Ga as a group III element and N as a group V element;

a second cladding layer of AlGaN having a second, opposite conductivity type, said second cladding layer being formed on said active layer epitaxially;

a first electrode provided so as to inject first-type carriers having a first polarity into said second cladding layer; and a second electrode provided on said substrate so as to inject second-type carriers having a second polarity, said substrate having a top surface separated from a bottom surface of said active layer by a distance of about 1.6 μm or more.

According to the present invention, the threshold current of the optical semiconductor device is successfully minimized.

Another object of the present invention is to provide an optical semiconductor device, comprising:

a substrate of SiC having a first conductivity type;

a first cladding layer having a first conductivity type, said first cladding layer being formed on said substrate epitaxially;

an active layer formed epitaxially on said first cladding layer;

a second cladding layer having a second, opposite conductivity type, said second cladding layer being formed on said active layer epitaxially;

a third cladding layer having said second conductivity type, said third cladding layer being formed on said second cladding layer epitaxially;

a first electrode provided so as to inject first-type carriers having a first polarity into said second cladding layer; and a second electrode provided on said substrate so as to inject second-type carriers having a second polarity, said third cladding layer having a ridge structure, wherein an insulating film is interposed between said second cladding layer and said third cladding layer, said insulating film having an opening in correspondence to said ridge structure, with a width smaller than a width of said ridge structure.

According to the present invention, the injection of the drive current is made into an narrowly confined region of the ridge structure, and an efficient control is made on the laser oscillation of the horizontal transverse mode. As a result, the optical semiconductor device shows a smooth operational characteristic free from kink from a low-power state producing a low-power optical beam to a high-power state producing a high-power optical beam.

Another object of the present invention is to provide an optical semiconductor device, comprising:

a substrate of SiC having a first conductivity type;

a first cladding layer having a first conductivity type, said first cladding layer being formed on said substrate epitaxially;

an active layer formed epitaxially on said first cladding layer;

a second cladding layer having a second, opposite conductivity type, said second cladding layer being formed on said active layer epitaxially;

a third cladding layer having said second conductivity type, said third cladding layer being formed on said second cladding layer epitaxially;

a contact layer of said second conductivity type, said contact layer being formed on said third cladding layer;

a first electrode provided on said contact layer;

a second electrode provided on said substrate;

said third cladding layer forming a ridge structure having a T-shaped cross-section, said third cladding layer including, at a bottom part thereof, a pair of cuts, such that said cuts penetrate from respective lateral sides of said ridge structure toward a center of said ridge structure.

According to the present invention, the area of the insulation mask used in corresponding to the foregoing cuts when forming the third cladding layer by a selective growth process is effectively minimized, and the formation of particles on the insulation film is minimized accordingly. As the insulation mask itself is removed after the selective growth process and before the step of forming the first electrode, the problem of deterioration of adhesion caused in the first electrode as a result of the existence of the particles is successfully eliminated. As the third cladding layer thus formed has a T-shaped cross-section characterized by a narrowly confined bottom part, the optical semiconductor device of the present invention is capable of injecting drive current selectively into the ridge region.

Another object of the present invention is to provide a method of fabricating an optical semiconductor device, comprising the steps of:

forming an insulation pattern on a semiconductor layer such that said insulation pattern has an opening; and forming, on said insulation pattern, a regrowth region of a nitride of Al and a group III element in correspondence to said opening, said step of forming the regrowth region being conducted by an metal-organic vapor phase epitaxy process.

According to the present invention, it becomes possible to form a regrowth region of a nitride of Al and a group III element on the insulation mask in correspondence to the opening formed in the mask by using an MOVPE (metalorganic vapor phase epitaxy) process. By using halogen together with the gaseous source in the MOVPE process, the formation of particles on the insulation mask is minimized.

Another object of the present invention is to provide an optical semiconductor device, comprising:

a substrate;

a first cladding layer of a nitride of a group III element formed epitaxially on said substrate, said first cladding layer having an n-type conductivity;

a first optical waveguide layer of a nitride of a group III element formed epitaxially on said first cladding layer, said first optical waveguide layer having an n-type conductivity;

an active layer of a nitride of a group III element formed epitaxially on said first optical waveguide layer;

an electron blocking layer of a nitride of a group III element formed epitaxially on said active layer, said electron blocking layer having a p-type conductivity;

a second optical waveguide layer of a nitride of a group III element farmed epitaxially on said electron blocking layer, said second optical waveguide layer having a p-type conductivity;

a second cladding layer of a nitride of a group III element formed epitaxially on said second optical waveguide layer, said second cladding layer having a p-type conductivity;

a contact layer of a nitride of a group III element formed epitaxially on said second cladding layer, said contact layer having a p-type conductivity;

a first electrode provided on said contact layer; and a second electrode provided on said substrate;

each of said electron blocking layer, said second optical waveguide layer and said second cladding layer being doped by Mg;

wherein said second optical waveguide layer and said second cladding layer contain Mg therein with a concentration level lower than a concentration level of Mg in any of said electron blocking layer and said contact layer.

According to the present invention, the problem of cracking of the epitaxial layers in the optical semiconductor device is minimized. Further, the drive voltage of the optical semiconductor device is also minimized.

Another object of the present invention is to provide a semiconductor wafer, comprising:

an SiC substrate having an n-type conductivity; and an AlGaN layer having an n-type conductivity formed on said SiC substrate with a composition represented as $Al_xGa_{1-x}N$, wherein said AlGaN layer has a carrier density in the range between $3 \times 10^{18} - 1 \times 10^{20}$ cm$^{-3}$, and wherein said compositional parameter x is larger than 0 but smaller than 0.4 (0<x<0.4).

According to the present invention, the resistance at the interface between the SiC substrate and the AlGaN buffer layer is minimized.

Other objects and further features of the present invention will become apparent from the following detailed description when read in conjunction with the attached drawings.

BRIEF DESCRIPTION OF THE DRAWINGS

FIG. 1 is a diagram showing the construction of a conventional GaN-family laser diode;

FIGS. 10A and 10B are diagrams showing the fabrication process of a laser diode according to a third embodiment of the present invention;

FIGS. 14A–14F are diagrams showing the fabrication process of a laser diode according to a fifth embodiment of the present invention;

DETAILED DESCRIPTION OF THE PREFERRED EMBODIMENT

[First Embodiment]

In the description hereinafter, the mixed crystal having the composition $Al_xGa_{1-x}N$ (0<x<0.4) will be designated merely as AlGaN. When the AlGaN mixed crystal has a composition falling in the foregoing range (0<x<0.4), the doping of AlGaN is possible. Further, the AlGaN mixed crystal having such a composition can be grown on an SiC substrate with a flat and smooth top surface. The epitaxial growth of the AlGaN mixed crystal is typically conducted by an MOVPE process, wherein the epitaxial layer thus formed shows a flat and smooth top surface when the deposition is made under a pressure of 100 Torr and the AlGaN mixed crystal contains Al with an atomic fraction x of 0.09 or more.

Thus, it is possible to construct a GaN-family laser diode on an n-type SiC substrate covered by an n-type $Al_xGa_{1-x}N$ buffer layer, by depositing desired epitaxial layers of GaN or a mixed crystal of GaN. The laser diode thus formed typically oscillates at the wavelength of 420 nm and has a threshold current of about 500 mA. While the laser diode thus formed oscillates at the desired blue to ultraviolet wavelength band as is expected, the laser diode also has a drawback in that the threshold voltage necessary for laser oscillation is very large, as large as about 22V, In view of the built-in potential of about 3V for the pn junction in a GaN crystal, the threshold voltage of the laser diode should be about 4–5 V if the laser diode is fabricated properly, Thus, the foregoing threshold voltage of 22V is deemed excessively large for a GaN-family laser diode.

The inventor of the present invention has conducted a series of experiments on the AlGaN/SiC epitaxial system in the investigation forming the basis of the present invention, and discovered that the foregoing large threshold voltage arises as a result of large AlGaN/SiC interface resistance between the SiC substrate and the AlGaN buffer layer.

In view of the fact that the band structure of SiC and AlGaN is not yet established to the date, and further in view of the expected existence of concentration of crystal defects at the interface between the SiC substrate and the AlGaN buffer layer, the theoretical approach for reducing the AlGaN/SiC interface resistance is expected to be difficult. Thus, the present invention explored the solution for reducing the AlGaN/SiC interface resistance experimentally.

Figure 2A:
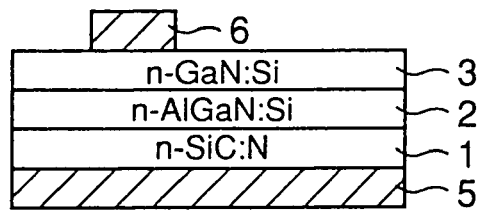
FIGS. 2A and 2B are diagrams showing the experiments constituting one of the basis of the present invention.

FIG. 2A shows the construction of the sample used in the experiment.

Referring to FIG. 2A, a bulk crystal ingot of Wurtzite-type 6H—SiC, doped by N to the n-type and grown by an improved Rayleigh process, was used for forming an SiC substrate 1. More specifically, the SiC substrate 1 was formed from the foregoing 6H—SiC bulk crystal ingot to have a thickness of about 200 $\mu$m, wherein the substrate 1 thus formed was defined by a principal surface of (0001)Si having a surface area of about 1 $cm^2$. The foregoing (0001) Si principal surface of the substrate 1 was then covered by a buffer layer 2 of n-type AlGaN grown thereon epitaxially by an MOVPE process with a thickness of about 1 $\mu$m. The AlGaN buffer layer 2 thus formed was doped by Si to the n-type. The MOVPE process for forming the buffer layer 2 was conducted at the substrate temperature of 1090° C. while using the gaseous sources of TMG (trimethylgallium), TEG (triethylgallium), TMA (trimethylaluminum) and ammonia ($NH_3$) together with an impurity gaseous source of monosilane ($SiH_4$).

After the formation of the buffer layer 2, a contact layer 3 of n-type GaN was grown further on the buffer layer 2 by an MOVPE process with a thickness of about 0.2 $\mu$m for reducing the contact resistance.

After the formation of the contact layer 3, a circular or stripe-shaped electrode 6 was formed on the GaN contact layer for measurement of the AlGaN/SiC interface resistance, more specifically the resistivity, between the substrata 1 and the buffer layer 2, and a Ni electrode 5 was provided on the bottom principal surface of the substrate 1 so as to cover the entirety thereof. It should be noted that the electrode 6 has a stacked structure including a lower layer of Ti and an upper layer of Al, wherein the electrode 6 was formed to have a diameter of 30–90 $\mu$m when the electrode 6 has a circular shape. When the electrode 6 has a stripe structure, the electrode 6 was formed of a stripe having a width of 2–15 $\mu$m and a length of 300–900 $\mu$m.

In the experiment, the carrier density was changed variously in the n-type AlGaN buffer layer 2 and also in the n-type SiC substrate, in combination with the Al content in the buffer layer 2 and the pressure used in the MOVPE process.

Figure 2B:
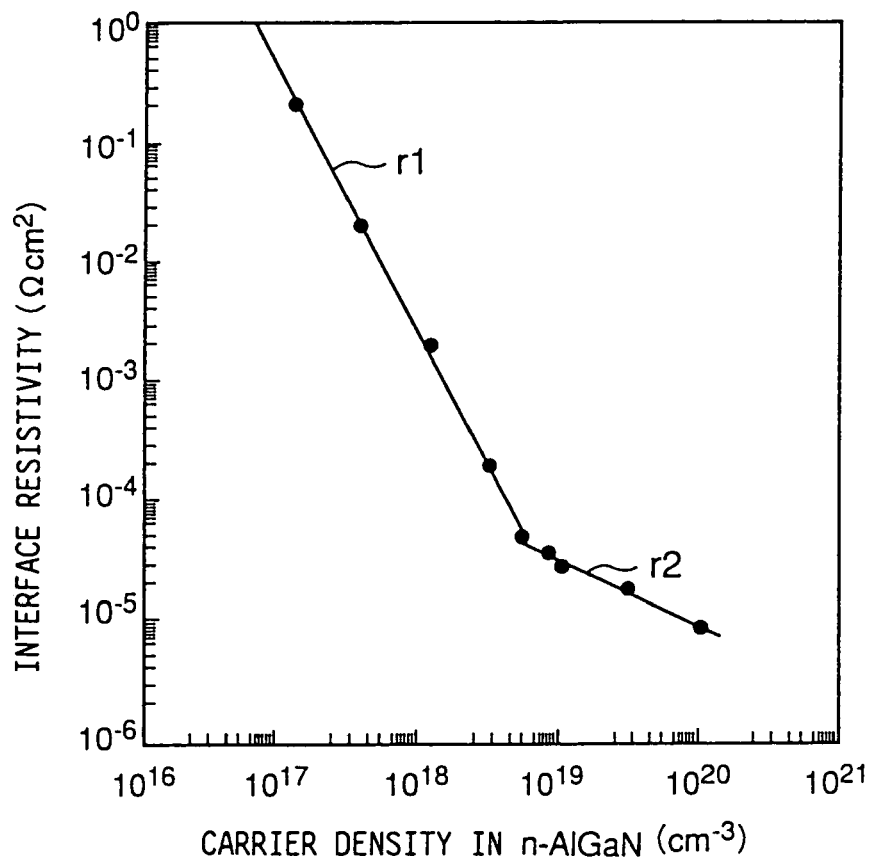

FIG. 2B shows the interface resistivity at the interface between the n-type SiC substrate 1 and the n-type AlGaN buffer layer 2 for the case the carrier density was changed, wherein the horizontal axis of FIG. 2B represents the n-type carrier density ($cm^{-3}$) in the AlGaN buffer layer 2 in a logarithmic scale, while the vertical axis of FIG. 2B represents the AlGaN/SiC interface resistivity ($\Omega cm^2$) also in a logarithmic scale. In the experiment of FIG. 2B, the carrier density in the SiC substrate 1 was set to $1\times10^{17}$ cm$^{-3}$ and the Al content x of the AlGaN buffer layer 2 was set to 0.09 (x=0.09).

Referring to FIG. 25, there are represented the value of the AlGaN/SiC interface resistivity for the structure of FIG. 2A in which the carrier density in the n-type AlGaN buffer layer 2 is changed from $1\times10^{17}$ cm$^{-3}$ to $1\times10^{20}$ cm$^{-3}$. In the construction of FIG. 2A, it should be noted that the bulk resistance is negligible for the electrodes 5 and 6, the SiC substrate 1, the AlGaN buffer layer 2 and the GaN contact layer 3, Further, the contact resistance of the electrode, more specifically the interface resistance at the interface between the AlGaN buffer layer 2 and the contact layer 3, is also negligible. Thus, the resistance measured across the electrodes 5 and 6 fairly represents the AlGaN/SiC interface resistance between the SiC substrate 1 and the AlGaN buffer layer 2.

As will be apparent from FIG. 2B the plot of the resistivity reveals the existence of two lines $r_1$ and $r_2$. More specifically, the experimental points are aligned on a line $r_2$ having a gentle gradient in the range of the carrier density larger than about $5\times10^{18}$ cm$^{-3}$, while the experimental points are aligned on a more steeper line $r_1$ when the carrier density is lower than the foregoing value of about $5\times10^{18}$ cm$^{-3}$.

It should be noted that the gentle gradient of the line $r_2$ indicates that the change of the AlGaN/SiC interface resistivity is small when the carrier density is changed. The existence of the two lines, $r_1$ and $r_2$, suggests that the physical phenomenon occurring in the range of the line $r_1$ may be different from the physical phenomenon occurring in the range of the line $r_2$. From FIG. 2B, it will be understood that a low interface resistivity is realized with reliability, by setting the carrier density in the n-type AlGaN buffer layer 2 to be larger than about $5\times10^{18}$ cm$^{-3}$.

In a GaN-family laser diode having a mesa structure, the entire resistance of the epitaxial layers generally takes the value of about $10\Omega$. Thereby, it is desired and necessary that the AlGaN/SiC interface resistance is substantially lower than the total resistance of the epitaxial layers.

In the event each epitaxial layer has a size of 700 µm×4 µm, the AlGaN/SiC interface resistance can be positively reduced to be smaller than the resistance of the entire epitaxial layers, even when the carrier density in the epitaxial layers is in the order of $3\times10^{18}$ cm$^{-3}$. Thus, it is preferable to dope the n-type AlGaN layer 2 to have a carrier density of about $3\times10^{18}$ cm$^{-3}$ or more, more preferable about $5\times10^{18}$ cm$^{-3}$ or more.

In doping the n-type AlGaN buffer layer 2, it was discovered that there appears a large amount of crystal defects on the surface of the AlGaN layer 2 when the carrier density in the layer 2 is set larger than the value of $1\times10^{20}$ cm$^{-3}$. Due to the excessive formation of the crystal defects, experiment for measuring the interface resistivity was not possible in this case. Thus, it is preferable that the carrier density in the n-type AlGaN buffer layer 2 does not exceed the foregoing value of about $1\times10^{20}$ cm$^{-3}$.

In the foregoing experiments, the carrier density of the n-type AlGaN buffer layer 2 on the n-type SiC substrate 1 was changed variously, while in the second-series experiments that follow the foregoing first-series experiments, the AlGaN/SiC interface resistivity was measured while changing the carrier density in the n-type SiC substrate 1 variously. In the second-series experiments, the composition of the n-type AlGaN buffer layer 2 was set to have an Al content x of 0.09 (x=0.09) and the carrier density of $5\times10^{18}$ cm$^{-3}$.

Figure 3:
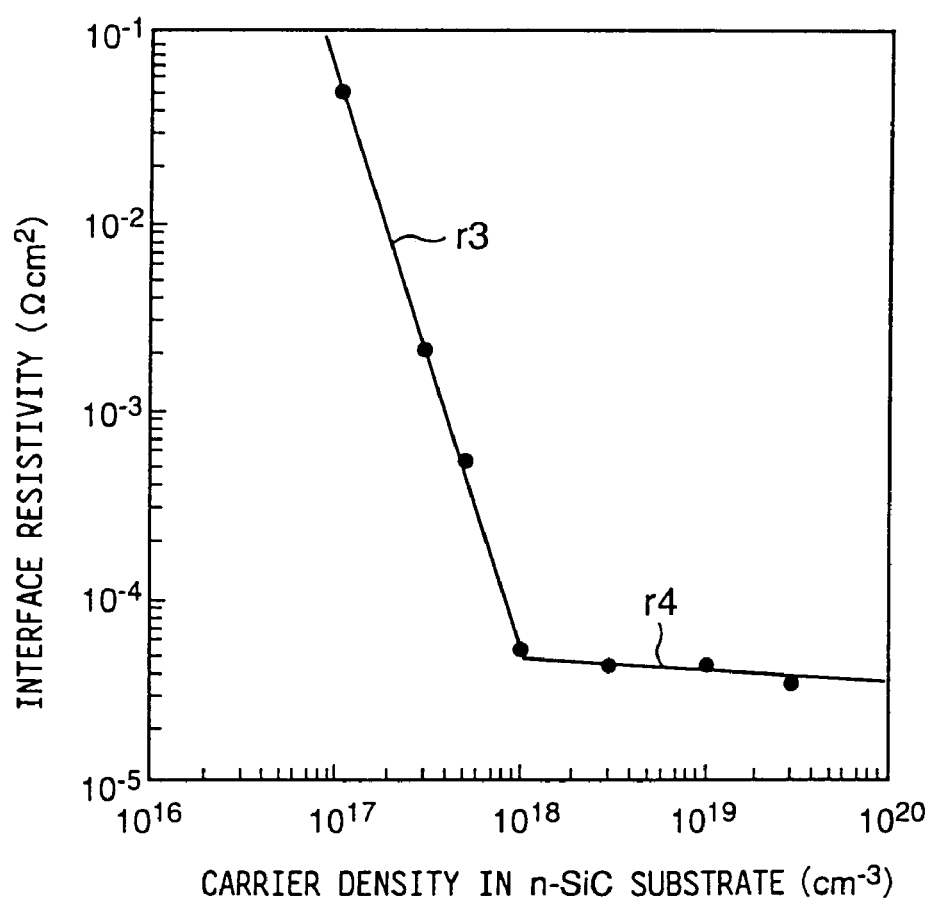
FIG. 3 is another diagram showing the experiments constituting one of the basis of the present invention.

FIG. 3 shows the result of measurement of the AlGaN/SiC interface resistivity for various carrier densities in the n-type SiC substrate 1 in the range from $1\times10^{17}$ cm$^{-3}$ to $3\times10^{19}$ cm$^{-3}$, wherein the horizontal axis shows the carrier density (cm$^{-3}$) represented in a logarithmic scale, while the vertical axis represents the AlGaN/SiC interface resistivity ($\Omega$cm) in a logarithmic scale.

As can be seen clearly from FIG. 3, the experimental points are aligned on two line $r_3$ and $r_4$. More specifically, the AlGaN/SiC interface resistivity is represented by the line $r_3$ in the range of the carrier density smaller than about $1\times10^{18}$ cm$^{-3}$. In the range of the carrier density larger than about $1\times10^{18}$ cm$^{-3}$, on the other hand, the AlGaN/SiC interface resistivity is represented by the line $r_4$.

In the second-series experiments, it was discovered that the quality of the SiC bulk crystal is deteriorated substantially when the carrier density therein is increased beyond the value of $1\times10^{20}$ cm$^{-3}$. Because of the poor quality of the SiC substrate 1, the experiment was not possible in the range of the carrier density exceeding the foregoing value of $1\times10^{18}$ cm$^{-3}$.

Summarizing above, it is concluded that the n-type SiC substrate 1 preferably has the carrier density in the range between about $1\times10^{18}$ cm$^{-3}$ and $1\times10^{20}$ cm$^{-3}$. When the carrier density is reduced below the foregoing value of $1\times10^{18}$ cm$^{-3}$, the AlGaN/SiC interface resistance increases sharply. When the carrier density exceeds the value of $1\times10^{18}$ cm$^{-3}$, on the other hand, the quality of the SiC substrate 1 is deteriorated.

Next, in the third-series experiment, an investigation was made on the effect of the Al content x in the n-type AlGaN buffer layer 2 on the AlGaN/SiC interface resistance. In the third-series experiment, the carrier density in the n-type SiC substrate 1 was set to about $1\times10^{18}$ cm$^{-3}$ and the carrier density in the n-type AlGaN buffer layer 2 was set to about $5\times10^{18}$ cm$^{-3}$.

Figure 4:
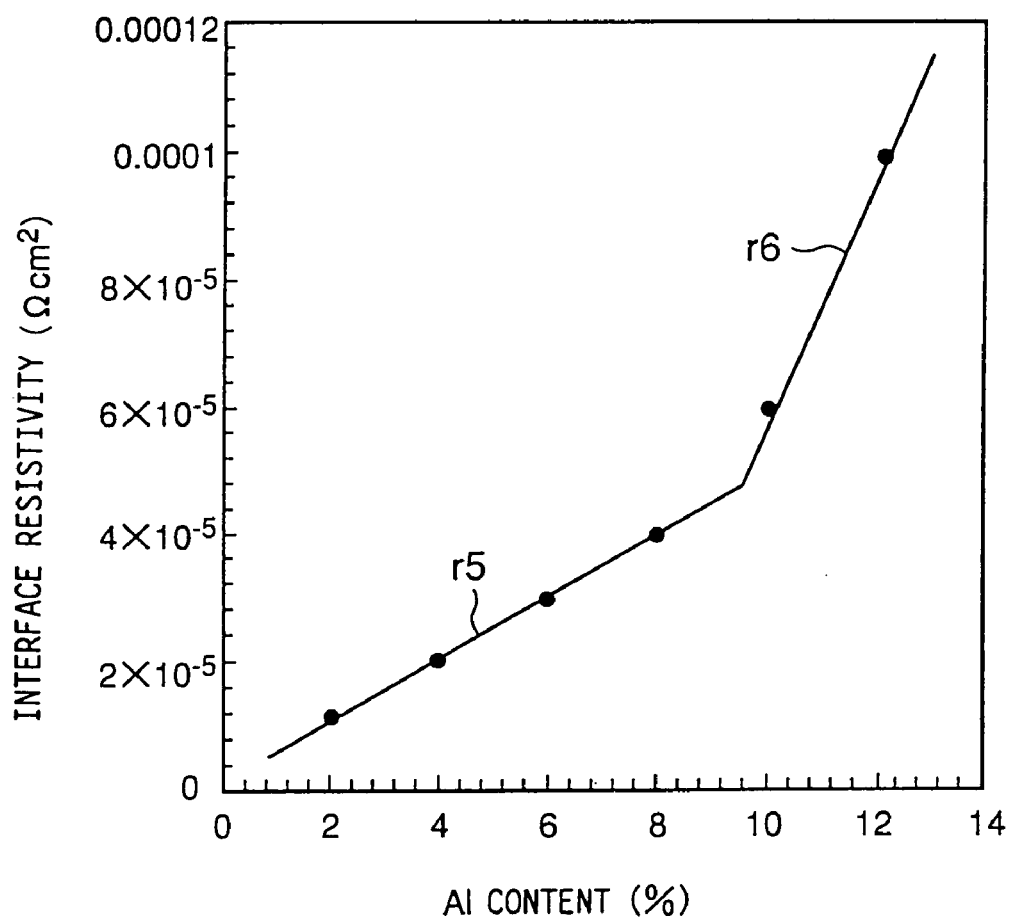
FIG. 4 is another diagram showing the experiments constituting one of the basis of the present invention.

FIG. 4 shows the AlGaN/SiC interface resistance of the n-type AlGaN buffer layer 2 for the case in which the Al content x of the buffer layer 2, represented as $Al_xGa_{1-x}N$, is changed variously, wherein the horizontal axis represents the compositional parameter x in terms of atomic percent, while the vertical axis represents the AlGaN/SiC interface resistivity.

As can be seen from FIG. 4, the experimental points are aligned on two lines, $r_5$ and $r_6$, wherein the AlGaN/SiC interface resistivity is represented by the line $r_5$ having a gentle gradient when the compositional parameter x is smaller than about 9%. When the compositional parameter x increased beyond the value of about 9%, on the other hand, the interface resistivity is represented by the line $r_6$ having a steeper gradient. Further, the interface resistivity increases with the compositional parameter x representing the Al content in the AlGaN buffer layer 2 in any of the lines $r_5$ and $r_6$. Thus, from the result of FIG. 4, it is preferable that the Al content x in the n-type AlGaN buffer layer 2 is set smaller than 9%.

In the foregoing first through third series experiments, the formation of the n-type AlGaN buffer layer 2 was conducted by an MOVPE process. On the other hand, it is believed that a similar result would be obtained also when the buffer layer 2 is formed by other deposition process such MBE (molecular beam epitaxy), as the value of the interface resistivity is primarily controlled by the band structure and the impurity concentration level.

Conventionally, the epitaxial growth of a GaN layer or a mixed crystal layer of GaN has been conducted by setting the pressure to about 100 Torr when the growth is made by MOVPE. In the foregoing experiments, the inventor of the present invention has discovered that it is necessary to increase the Al content x in the n-type AlGaN buffer layer 2, which is grown directly on the SiC substrate 1, to be larger than 8% in order to obtain a flat and smooth top surface. Further, the inventor of the present invention has discovered that a flat and smooth top surface can be obtained for the n-type AlGaN buffer layer 2 even when the Al content x therein is smaller than 8%, by reducing the pressure in the MOVPE process.

Figure 5:
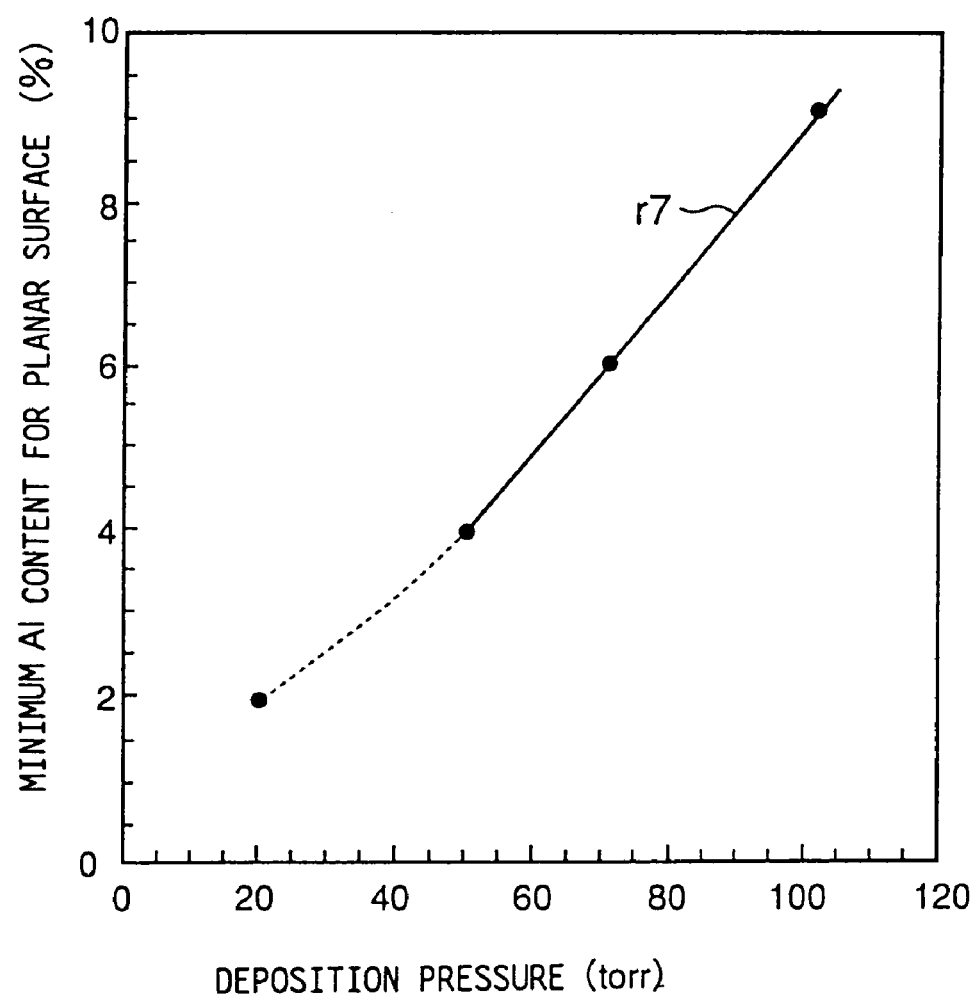
FIG. 5 is another diagram showing the experiments constituting one of the basis of the present invention.

FIG. 5 shows the minimum Al content x needed for obtaining a planar and smooth top surface for the n-type AlGaN buffer layer 2, grown on the n-type SiC substrate 1 by the MOVPE process, as a function of the pressure used in the MOVPE process. More in detail, the horizontal axis of FIG. 5 represents the pressure represented in Torr, while the vertical axis represents the minimum Al content x in terms of percent. In FIG. 5, the horizontal axis and the vertical axis are represented in a linear scale.

Referring to FIG. 5, it will be noted that the minimum Al content x needed for obtaining a flat and smooth top surface for the AlGaN buffer layer 2 decreases gradually with decreasing pressure used in the MOVPE process along a line $r_7$. In other words, the relationship of FIG. 5 represents the fact that the desired flat and smooth top surface can be obtained for the n-type AlGaN buffer layer 2 even when the Al content therein is small, by decreasing the pressure in the MOVPE process.

In the representation of FIG. 5, it should be noted that the Al content in the vertical axis may contain an error of about ±1%. Thus, the deviation of the experimental point for the pressure of 20 Torr from the line $r_7$ may or may not be the result of the error. It should be noted that the experimental points for the pressure of 100 Torr, 70 Torr and 50 Torr are aligned on the line $r_7$.

In the description hereinafter, it is noted that the value x, indicative of the Al content in the AlGaN buffer layer 2 and represented in terms of percent, includes an error of about ±1%.

From the result of FIG. 5, it is concluded that the MOVPE process is conducted under a pressure of about 90 Torr or less when to grow an AlGaN layer on an SiC substrate with a flat and smooth top surface and with an Al content of about 8%. In order to grow a similar AlGaN layer with an Al content of about 6%, on the other hand, it is preferable to conduct the MOVPE process under a pressure of about 70 Torr or less. Further, in order to grow a similar AlGaN layer with an Al content of about 4%, it is preferable to conduct the MOVPE process under a pressure of about 50 Torr or less. In order to grow a similar AlGaN layer with an Al content of about 2%, it is preferable to conduct the MOVPE process under a pressure of about 20 Torr or less.

In view of the foregoing experimental results, it is possible to grow an n-type AlGaN buffer layer on an n-type SiC substrate epitaxially such that the AlGaN/SiC interface resistance is minimized and simultaneously the AlGaN buffer layer has a flat and smooth top surface. By growing epitaxial layers on the SiC substrate thus covered by the buffer layer, it is possible to form a GaN-family laser diode having a reduced threshold voltage. As a result of the use of the SiC substrate, it should be noted that the laser diode includes the n-side electrode formed on the SiC substrate, similarly to a usual edge-emission type laser diode.

Figure 6:
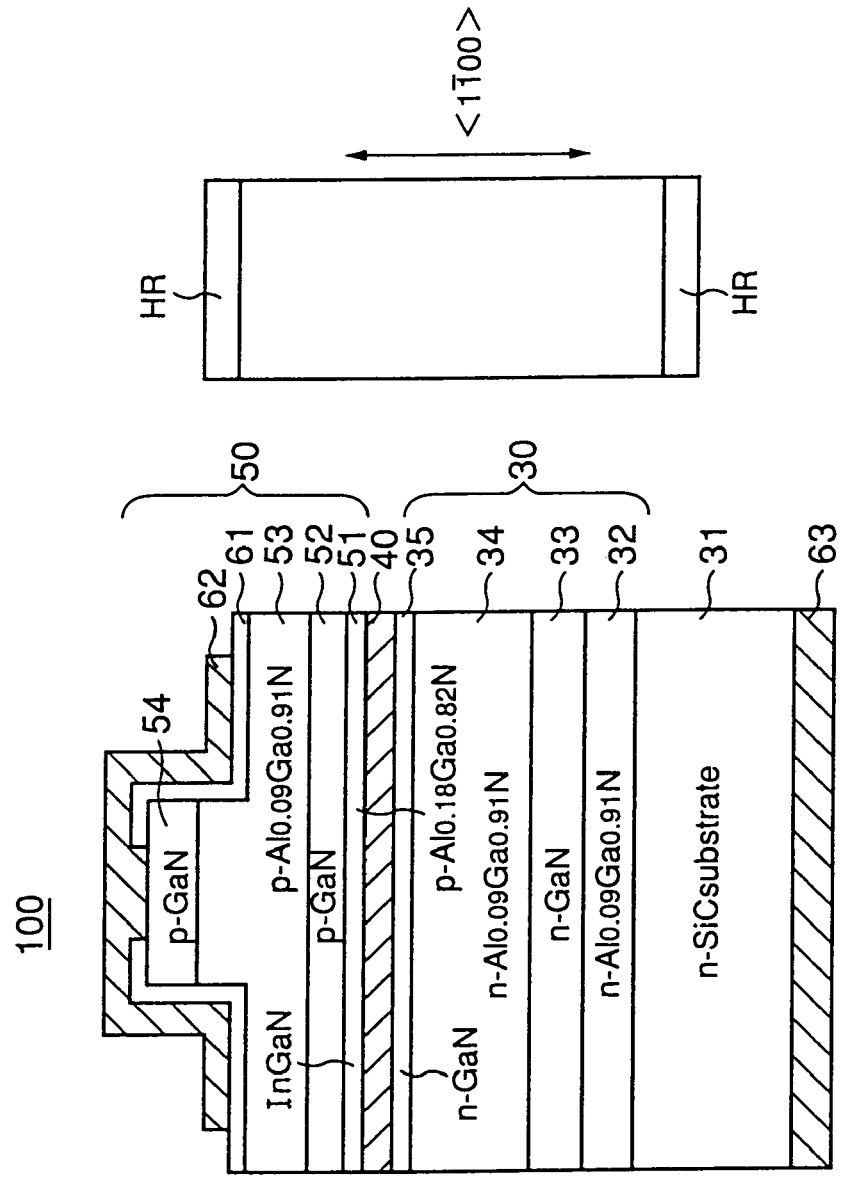
FIGS. 6A and 6B are diagrams showing the construction of a laser diode according to a first embodiment of the present invention.

FIGS. 6A and 6B show the construction of a GaN-family laser diode 100 based on the foregoing experiments.

Referring to FIG. 6A, the GaN-family laser diode 100 is constructed on an n-type 6H—SiC substrate 31 having a Wurtzite structure and defined by a (0001)Si top surface, The substrate 31 is doped by n to a carrier density of about $8 \times 10^{17} cm^{-3}$, for example.

On the foregoing (0001)Si surface of the substrate 31, there is provided an n-type epitaxial structure 30, and an active layer structure 40 is formed on the epitaxial structure 30. Further, another epitaxial structure 50 of the p-type is formed on the active layer structure 40.

It should be noted that the n-type epitaxial structure 30 includes a buffer layer 32 of n-type AlGaN having a composition of $Al_{0.09}Ga_{0.91}N$ grown epitaxially on the (0001)Si surface of the substrate 31, another buffer layer 33 of n-type GaN formed epitaxially on the buffer layer 32, a cladding layer 34 of n-type AlGaN having a composition of $Al_{0.09}Ga_{0.91}N$ grown epitaxially on the buffer layer 33, and an optical waveguide layer 35 of n-type GaN grown epitaxially on the cladding layer 34. The buffer layer 32 of the n-type AlGaN may have a thickness of about 0.15 $\mu$m and is doped with Si to an impurity concentration level of about $8 \times 10^{18} cm^{-3}$. The buffer layer 33, in turn, has a thickness of about 0.1 $\mu$m and is doped with Si to an impurity concentration level of about $3 \times 10^{18} cm^{-3}$. Further, the cladding layer 34 of n-type AlGaN has a thickness of typically about 0.5 $\mu$m and is doped with Si to an impurity concentration level of about $3 \times 10^{18} cm^{-3}$. The optical waveguide layer 35 of n-type GaN has a thickness of about 0.1 $\mu$m and is doped with Si to a concentration level of about $3 \times 10^{18} cm^{-3}$.

The active layer structure 40 forms an MQW (multiple quantum well) structure formed of alternate and repetitive stacking of a quantum well layer of undoped InGaN having a composition of $In_{0.15}Ga_{0.85}N$ and a barrier layer of undoped InGaN having a composition of $In_{0.03}Ga_{0.97}N$, wherein the quantum well layer typically has a thickness of about 4.0 nm while the barrier layer has a thickness of typically about 5.0 nm. In one example, the quantum well layer is repeated three times and there are provided four barrier layers in all in the MQW active layer structure 40.

The p-type epitaxial structure 50 includes an electron blocking layer 51 of p-type AlGaN having a composition of $Al_{0.18}Ga_{0.82}N$ grown epitaxially on the active layer structure 40, an optical waveguide layer 52 of p-type GaN formed epitaxially on the electron blocking layer 51, a cladding layer 53 of p-type AlGaN having a composition of $Al_{0.09}Ga_{0.91}N$ grown epitaxially on the optical waveguide layer 52, and a contact layer 54 of p-type GaN grown epitaxially on the cladding layer 53. The electron blocking layer 51 of p-type AlGaN has a large bandgap and blocks the electrons overflowing from the active layer structure 40 underneath.

Typically, the electron blocking layer 51 has a thickness of about 20 nm and is doped with Mg to an impurity concentration level of about $5 \times 10^{19} cm^{-3}$. The GaN optical waveguide layer 52, in turn, has a thickness of about 0.1 $\mu$m and is doped with Mg to an impurity concentration level of about $5 \times 10^{19} cm^{-3}$. Further, the cladding layer 53 of p-type AlGaN has a thickness of typically about 0.5 $\mu$m and is doped with Mg to an impurity concentration level of about $5 \times 10^{19} cm^{-3}$. The contact layer 54 of p-type GaN has a thickness of about 0.2 $\mu$m and is doped with Mg to a concentration level of about $5 \times 10^{19} cm^{-3}$. By providing the contact layer 54, the contact resistance of a p-side electrode provided thereon is reduced.

The foregoing epitaxial layers are grown on the SiC substrate 31 by MOVPE under a reduced pressure of about 100 Torr. In the MOVPE process, TMG or TEG is used for the gaseous source of Ga, TMA is used for the gaseous source of Al, TMI (trimethylindium) is used for the gaseous source of In, and $NH_3$ is used for the source of N, together with the dopant gas of $SiH_4$ or biscyclopentadienyl magnesium ($Cp_2Mg$).

The n-type SiC substrate 31 may be formed from a bulk crystal ingot of n-type SiC grown by an improved Rayleigh method that uses a seed crystal.

It should be noted that the n-type epitaxial structure 30 may be formed by conducting the MOVPE process at a substrate temperature of 1090° C. with a growth rate of about 2 μm/H. On the other hand, the MQW structure of the active layer structure 40 may be formed by conducting the MOVPE process at a substrate temperature of 780° C. with a growth rate of about 0.3 μm/H. Further, the p-type epitaxial structure 50 may be formed by conducting the MOVPE process at a substrate temperature of 1130° C. with a growth rate of about 1 μm/H.

In the GaN-family laser diode 100 thus obtained, it should be noted that the AlGaN/SiC interface resistance at the interface between the n-type SiC substrate 31 and the n-type AlGaN buffer layer 32 is successfully suppressed in view of the fact that the n-type AlGaN buffer layer 32 having the composition of $Al_{0.09}Ga_{0.91}N$ contains the n-type carriers with the carrier density of about $8 \times 10^{18}$ $cm^{-3}$. See the diagram of FIG. 23. It should be noted that the thickness of the n-type SiC substrate 31 may be reduced, from an initial thickness of about 200 μm, to about 100 μm by polishing the rear surface thereof.

After the formation of the epitaxial structures 30, 40 and 50 on the Si substrate 31, the epitaxial structures are subjected to a dry etching process and a mesa structure having a width of 3–5 μm, typically 3.5 μm, is formed to extend in the axial direction of the laser diode with a height of about 0.4 μm. As a result of the mesa formation, there is formed a refractive optical guide structure in the cladding layer 53 wherein the optical guide structure thus formed controls the transverse mode of laser oscillation.

After the mesa formation, an insulation film 61 of $SiO_2$ is formed so as to cover the mesa structure thus formed in the cladding layer 53 and the contact layer 54, followed by formation of a contact window in the insulation film 61 so as to expose the contact layer 54, The contact window thus formed may have a width of 1–4 μm.

After the step of formation of the contact window, an n-side electrode 63 is formed on the SiC substrate 31 by depositing a Ni layer, a Ti layer and a Au layer consecutively on the bottom surface of the SiC substrate. Further, a p-side electrode 62 is formed on the mesa structure by depositing a Ni layer, a Ti layer and a Au layer consecutively.

The structure thus obtained is then subjected to a cleaving process in the direction perpendicular to the elongating direction of the mesa structure, in other words the axial direction of the laser diode, to form a ridge-type cavity having a length of about 700 μm as represented in FIG. 6B. It should be noted that the ridge-type cavity extends in the <1100> direction of the SiC substrate 31, while the cleavage surface has an orientation of [1100]. In the structure of FIG. 6B, mirrors HR are formed on the cleaved surfaces.

It was confirmed that the GaN-family laser diode 100 thus formed oscillates at the optical wavelength of 420 nm when driven by a pulse generator at a frequency of 1 kHz–10 kHz. Thereby, it was observed that the threshold current is about 500 mA and the threshold voltage is about 15V.

For the sake of comparison, a laser diode similar to the GaN-family laser diode 100 was fabricated in which the carrier density of the n-type AlGaN buffer layer 32 is set to $3 \times 10^{18}$ $cm^{-3}$ while maintaining the composition of the buffer layer 32 to $Al_{0.09}Ga_{0.91}N$. In this experiment, although it was confirmed that the laser diode oscillates at the optical wavelength of 420 nm, the threshold voltage has increased to 22V. The threshold current remained the same and took the value of 500 mA. The foregoing result indicates that the threshold voltage of the laser diode is reduced from 22V to 15V, by increasing the carrier density in the n-type AlGaN buffer layer 32 having the composition of $Al_{0.09}Ga_{0.91}N$ from $3 \times 10^{18}$ $cm^{-3}$ to $8 \times 10^{18}$ $cm^{-3}$.

Further, another experiment was conducted by fabricating a laser diode similar to the laser diode 100 except that the carrier density in the n-type SiC substrate 31 is increased from $8 \times 10^{17}$ $cm^{-3}$ to $4 \times 10^{18}$ $cm^{-3}$.

It was confirmed that the laser diode thus formed oscillates at the optical wavelength of 420 nm similarly to the laser diode 100 and that the threshold voltage was decreased to 12V, indicating a further decrease by 3V as compared with the laser diode 100. The threshold current remained the same.

In view of the relationship of FIG. 2B, it is expected that the threshold voltage may be decreased further by increasing the carrier density in the n-type AlGaN buffer layer 32. Further, the relationship of FIG. 4 indicates that the AlGaN/SiC interface resistance, and hence the threshold voltage of the laser diode, is reduced further by reducing the Al content in the AlGaN buffer layer 32 below the value of 0.09.

In order to maintain the flat and smooth surface for the AlGaN buffer layer 32 for the case in which the Al content is reduced, it is preferable to conduct the MOVPE process for forming the AlGaN buffer layer 32 under a reduced pressure environment, in view of the relationship of FIG. 5. For example, the buffer layer 32 may be formed to have a composition $Al_{0.04}Ga_{0.96}N$ in place of the composition of $Al_{0.09}Ga_{0.91}N$ by conducting the MOVPE process under the pressure of 40 Torr. Other epitaxial layers are formed similarly to the case of the laser diode 100.

When the Si concentration level of $8 \times 10^{18}$ $cm^{-3}$ is used in the n-type AlGaN buffer layer 32 in combination with the foregoing composition of $Al_{0.04}Ga_{0.96}N$, it is expected that the threshold voltage decreased to about 10V. By further reduction of the Al content in the n-type AlGaN buffer layer 32, the AlGaN/SiC interface resistance, and hence the threshold voltage, would be reduced further.

[Second Embodiment]

During the experimental investigation on the GaN-family laser diode 100 described with reference to FIGS. 6A and 6B, the inventor of the present invention has discovered a relationship shown in FIG. 7 between the threshold current and the thickness of the epitaxial layers interposed between the SiC substrate 41 and the active layer structure 40, wherein the vertical axis represents the threshold current density of the laser diode while the horizontal axis represents the total thickness of the epitaxial layers interposed between the SiC substrate 31 and the active layer structure 40.

Figure 7:
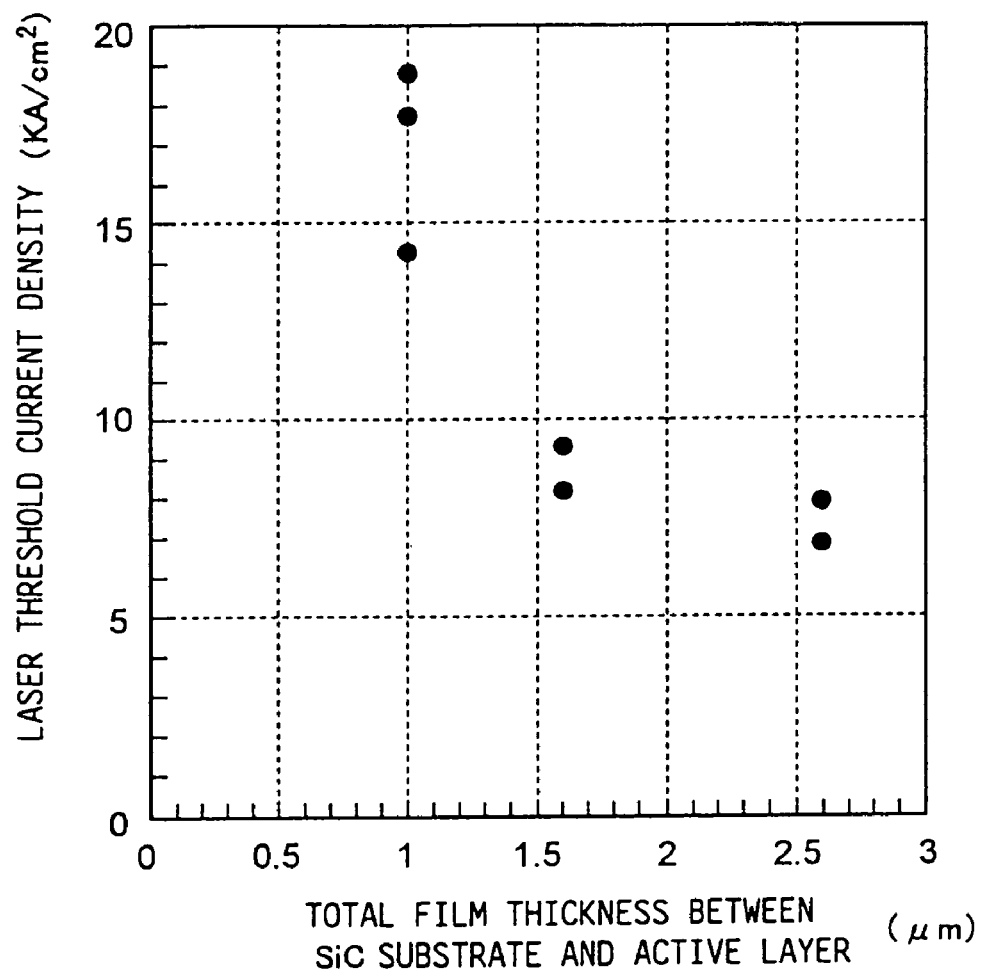
FIG. 7 is a diagram showing the experiments constituting one of the basis of the present invention.

Referring to FIG. 7, the threshold current generally decreases with increasing thickness in the epitaxial layers interposed between the substrate 31 and the active layer 40 and that the decrease occurs sharply until the total thickness of the epitaxial layers reach the value of about 1.6 μm.

While the reason of this phenomenon is not clearly understood, it is probable that the defect density in the epitaxial layers decreases with increasing total thickness of the epitaxial layers between the substrate 31 and the active layer structure 40.

Thus, in view of the relationship of FIG. 7, it is concluded that the threshold current of the laser diode can be reduced by increasing the total thickness of the epitaxial layers interposed between the substrate 31 and the active layer structure 40. On the other hand, there arises a problem of cracking in the epitaxial structure 30, 40 or 50 when the foregoing total thickness is increased excessively, probably due to the tensile stress caused as a result of the difference in thermal expansion between the SiC substrate 31 and the nitride epitaxial layers thereon.

The inventor of the present invention has discovered that the cracking of the epitaxial structures is effectively suppressed by setting the Al content y of the lower cladding layer 34 of n-type AlGaN having a composition represented as $Al_yGa_{1-y}N$, to be smaller than the Al content x of the foregoing n-type AlGaN buffer layer 32, of which composition is represented as $Al_xGa_{1-x}N$ (y<x). Further, the inventor of the present invention has discovered that the problem of cracking of the epitaxial layers is further suppressed by setting the Al content z of the upper cladding layer 53 of p-type AlGaN having a composition represented as $Al_zGa_{1-z}N$, to be smaller than the Al content y in the lower cladding layer 34 (z<y). It is believed that the foregoing suppression of the crack formation in the epitaxial layers is achieved as a result of cancellation of the tensile stress, which is induced in the epitaxial layer by the differential thermal expansion of the SiC substrate 31 and the epitaxial layers, by a compressive stress. It should be noted that the foregoing compressive stress is induced in the epitaxial layers including the buffer layer 32 and the cladding layers 34 and 53 as a result of the difference in the lattice constant between the SiC substrate 31 and the epitaxial layers thereon.

Figure 8:
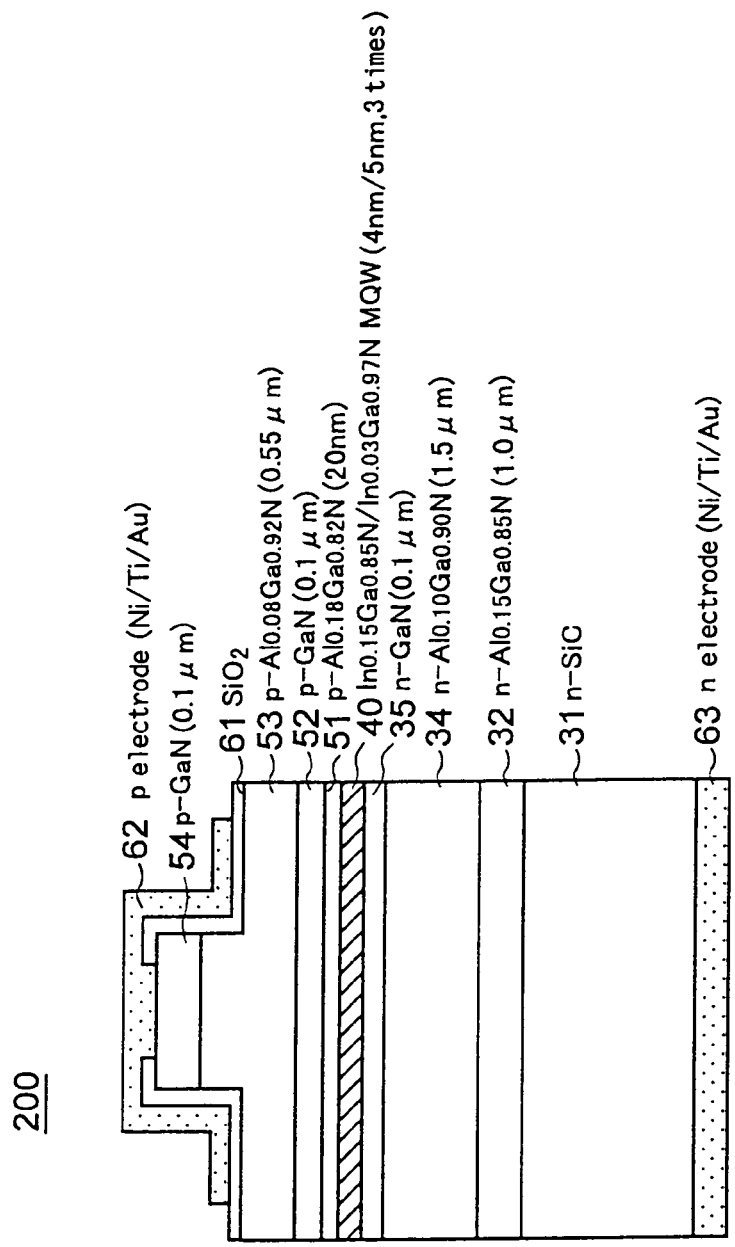
FIG. 8 is a diagram showing the construction of a laser diode according to a second embodiment of the present invention.

FIG. 8 shows the construction of a laser diode 200 according to a second embodiment of the present invention, wherein those parts corresponding to the part described previously are designated by the same reference numerals and the description thereof will be omitted, Referring to FIG. 8, the laser diode 200 has a construction in which the GaN buffer layer 33 is omitted, and the AlGaN buffer layer 32, the AlGaN cladding layer 34 and the GaN optical waveguide layer 35 are formed to have respective thicknesses of 1.0 μm, 1.5 μm and 0.1 μm. As a result, the total thickness of the epitaxial layers interposed between the SiC substrate 31 and the active layer structure 40 takes a value of 2.6 μm, and the threshold current density of laser oscillation 200 is reduced to about 7–8 kA/cm².

In the present embodiment, it should be noted that the lower cladding layer 34 of n-type AlGaN contains Al with an atomic fraction y of 0.10 (y= 0.10), while this value of the Al content y is smaller than the Al content x of 0.15 (x=0.15) of the n-type AlGaN buffer layer 32. Further, it should be noted that the upper cladding layer 53 of p-type AlGaN contains Al with an atomic fraction z of 0.08 (z= 0.08), while this value z of the Al content of the upper cladding layer 53 is smaller than the foregoing value y for the lower cladding layer 34.

As a result of the foregoing construction, the laser diode 200 of the present embodiment successfully eliminates the crack formation in the epitaxial layers.

Other features of the present embodiment are substantially the same as those of the laser diode 100 described previously and further description thereof will be omitted.

Figure 9:
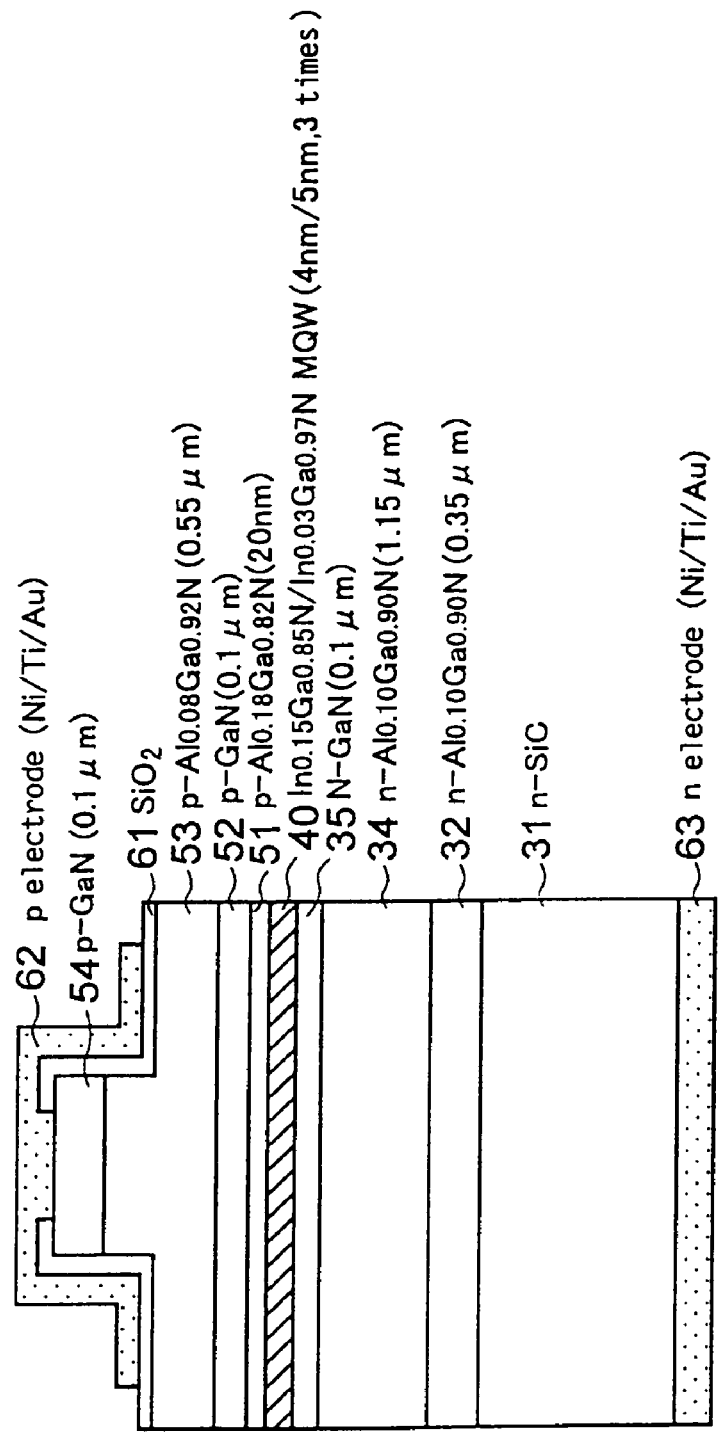
FIG. 9 is a diagram showing a modification of the laser diode of FIG. 8.

FIG. 9 shows the construction of a laser diode 210 corresponding to a modification of the laser diode 210 of the present embodiment, wherein those parts corresponding to the parts described previously are designated by the same reference numerals and the description thereof will be omitted.

In the present modification, the buffer layer 32, the cladding layer 34 and the optical waveguide layer 35 are formed to have respective thicknesses of 0.35 μm, 1.15 μm and 0.1 μm, thus leading to the total thickness of 1.6 μm for the epitaxial layers interposed between the SiC substrate 31 and the active layer structure 40. In the present modification, the buffer layer 32 and the lower cladding layer 34 are formed to have the same Al content of 0.10 for the compositional parameters x and y, while the upper cladding layer 53 contains Al with a reduced content of 0.08 for the compositional parameter z. Thereby, the problem of cracking of the epitaxial layers is suppressed effectively also in the present modification.

[Third Embodiment]

In the ridge-type laser diode 100, 200 or 210 described before, the control of transversal mode laser oscillation in the active layer structure 40 is achieved by forming a mesa structure in the upper cladding layer 53 as explained before.

In the ridge-type laser diode having such a structure, it is necessary to form the mesa structure to have a width of less than about 2 μm in order to achieve a satisfactory control of the transversal mode oscillation, while the formation of such a narrow mesa structure has been difficult. Further, the foregoing conventional ridge-type laser diode has a drawback in that the contact area between the electrode 62 and the contact layer 54 is reduced inevitably when the width of the mesa structure is thus reduced below 2 μm. It should be noted that the width of the contact window formed in the $SiO_2$ film 61 is reduced together with the width of the mesa structure, while formation of such a very small contact window in the $SiO_2$ film 61 on the mesa structure raises various problems.

Further, the ridge-type laser diodes have a further drawback in that the confinement of the optical radiation in-side the active layer structure 40 in the vertical direction tends to become weak and insufficient. In order to realize a satisfactorily strong optical confinement in the active layer structure 40, it is necessary to increase the thickness of the upper cladding layer 53 further, while such an increase of thickness of the upper cladding layer 53 tends to cause a cracking therein. It should be noted that the cladding layer 53 has a lattice constant different from that of the buffer layer 32. In view of insufficient optical confinement in the active layer structure 40, the ridge-type laser diodes including the laser diodes 100, 200 and 210 tend to show the problem of optical loss caused by the electrode 62 or poor far-field pattern (FFP) in the optical beam produced by the laser diode.

Figure 10A:
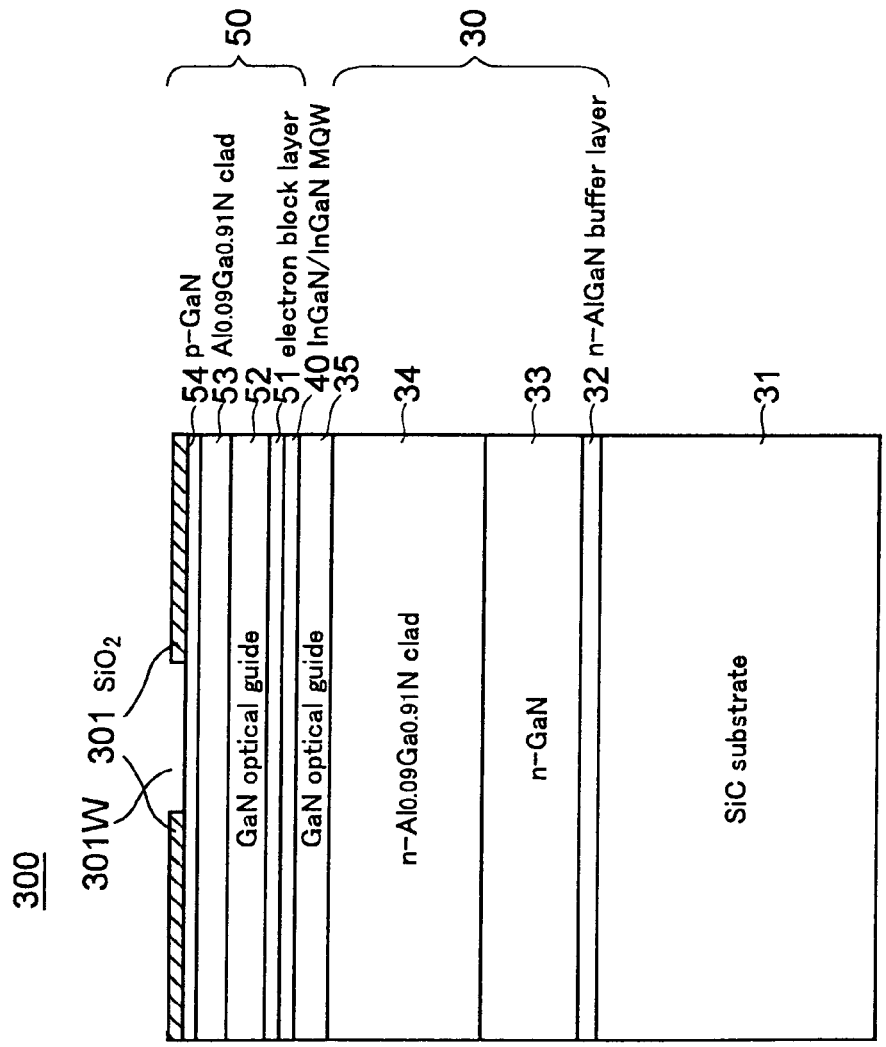

FIGS. 10A and 10B show a fabrication process of a laser diode 300 wherein the foregoing problems are eliminated, wherein those parts corresponding to the parts described previously are designated by the same reference numerals and the description thereof will be omitted.

Referring to FIG. 10A, the laser diode 300 is constructed on the n-type SiC substrate 31 carrying thereon the n-type epitaxial structure 30, the active layer structure 40 and the p-type epitaxial structure 50 similarly to the laser diodes of the previous embodiments, wherein the mesa formation in the upper cladding layer 53 or the contact layer 54 forming a part of the p-type epitaxial structure 50 is omitted. It should be noted that the n-type epitaxial structure 30 includes the n-type nitride layers 32–35 while the p-type epitaxial structure includes the p-type nitride layers 51–54 similarly as before. As a result, the contact layer 54 has a flat top surface and an insulation film 301 of SiO$_2$ is formed on the flat top surface of the contact layer 54 by a high-temperature CVD process with a thickness of about 300 nm.

The SiO$_2$ film 301 is then patterned by a photolithographic process using HF as an etchant to form a stripe opening 301W in the SiO$_2$ film 301 with a width of about 1 μm, wherein the strips opening 301W is formed so as to extend in the axial direction of the laser diode 300 coincident with the <1100> direction of the SiC substrate 31.

Next, in the step of FIG. 10B, the deposition of a p-type ALGaN layer having a composition of Al$_{0.09}$GA$_{0.91}$N is made on the exposed part of the GaN cap layer 54 exposed at the foregoing stripe opening 301W by an MOVPE process while using the SiO$_2$ film 301 as a mask, to form a third cladding layer 302 with a thickness of about 1.4 μm. It should be noted that the MOVPE process is conducted under a condition similar to the condition used for forming the epitaxial layers in the p-type epitaxial structure 50. The third cladding layer 302 thus grow not only in the upward direction but also in lateral directions to form a ridge structure covering the insulation film 301 and extending thereon in the axial direction of the laser diode.

Next, in the step of FIG. 10B, a contact layer 303 of p-type GaN is formed on the third cladding layer 302 by an MOVPE process with a thickness of about 0.2 μm so as to cover both side walls and a top surface thereof continuously, and the electrode 62 is deposited so as to cover the contact layer 303 continuously over a part corresponding to the side walls and the top surface of the underlying third cladding layer 302. Further, the bottom surface of the n-type SiC substrate 31 is polished and the electrode 63 is formed on the bottom surface of the SiC substrate 31 thus polished, similarly to the embodiments described before.

According to the laser diode 300 of the present embodiment, the photolithographic patterning process of the insulation film 301 is conducted in the step of FIG. 10A on the flat, planar principal surface of the GaN cap layer 54. Thereby, the patterning process is under an ideal condition with an excellent precision and the stripe opening 301W is formed relatively easily to have a width of less than 1 μm.

In the present embodiment, it should be noted that the cap layer 54 of GaN is provided for preventing the oxidation of the AlGaN cladding layer 53 when forming the insulation film 301. The insulation film 301 is by no means limited to SiO$_2$ but other materials such as SiN or Al$_2$O$_3$ may also be used.

It should be noted that the structure of the present embodiment is applicable also to the conventional laser diode constructed on a sapphire substrate such as the one described with reference to FIG. 1. When using a sapphire substrate, the stripe opening 301W is formed in the insulation film 301 so as to extend in the <1120> direction of the sapphire substrate corresponding to the <11> direction of a GaN crystal.

According to the laser diode 300 of the present embodiment, in which the electrode 62 covers the top surface and both side walls of the third cladding layer 302 continuously via the contact layer 303, the contact resistance of the electrode 62 is reduced substantially. Further, in view of the fact that the injection of carriers (holes) into the active layer structure 40 is restricted to the foregoing elongating stripe opening 301W, the desired current confinement in the active layer structure 40 is achieved effectively without restricting the width of the cladding layer 302 strictly. Thereby, an effective control of the transverse mode becomes possible.

As the cladding layer 302 is formed as a result of the selective growth of the AlGaN layer occurring in the narrowly confined stripe opening 301W, there occurs no substantial problem of relaxation of crystal lattice in the AlGaN cladding layer 302 and the crack formation does not occur in the cladding layer 302 even when the third cladding layer 302 is formed to have an increased thickness. Thereby, an excellent optical confinement is realized in the vertical direction and the far-field pattern of the laser diode is improved substantially. Further, the problem of optical loss caused by the electrode 62 is also reduced.

In the step of FIG. 10B, there may be a case in which particles are formed on the insulation film 301 during the process of forming the cladding layer 302 or the contact layer 303 by the selective growth process. It should be noted that the insulation film 301 is used in the foregoing selective growth process as a mask. When there occurs such a deposition of particles on the insulation film 301, the adherence of the electrode 62 may be deteriorated.

In order to avoid the foregoing risk of deterioration of adherence of the electrode 62, the SiO$_2$ film 301 may be removed by a wet etching process after the formation of the cladding layer 301 and the contact layer 303 by using a suitable etchant such as HF. As a result of removal of the SiO$_2$ film 301, the particles deposited thereon are also removed.

Figure 11:
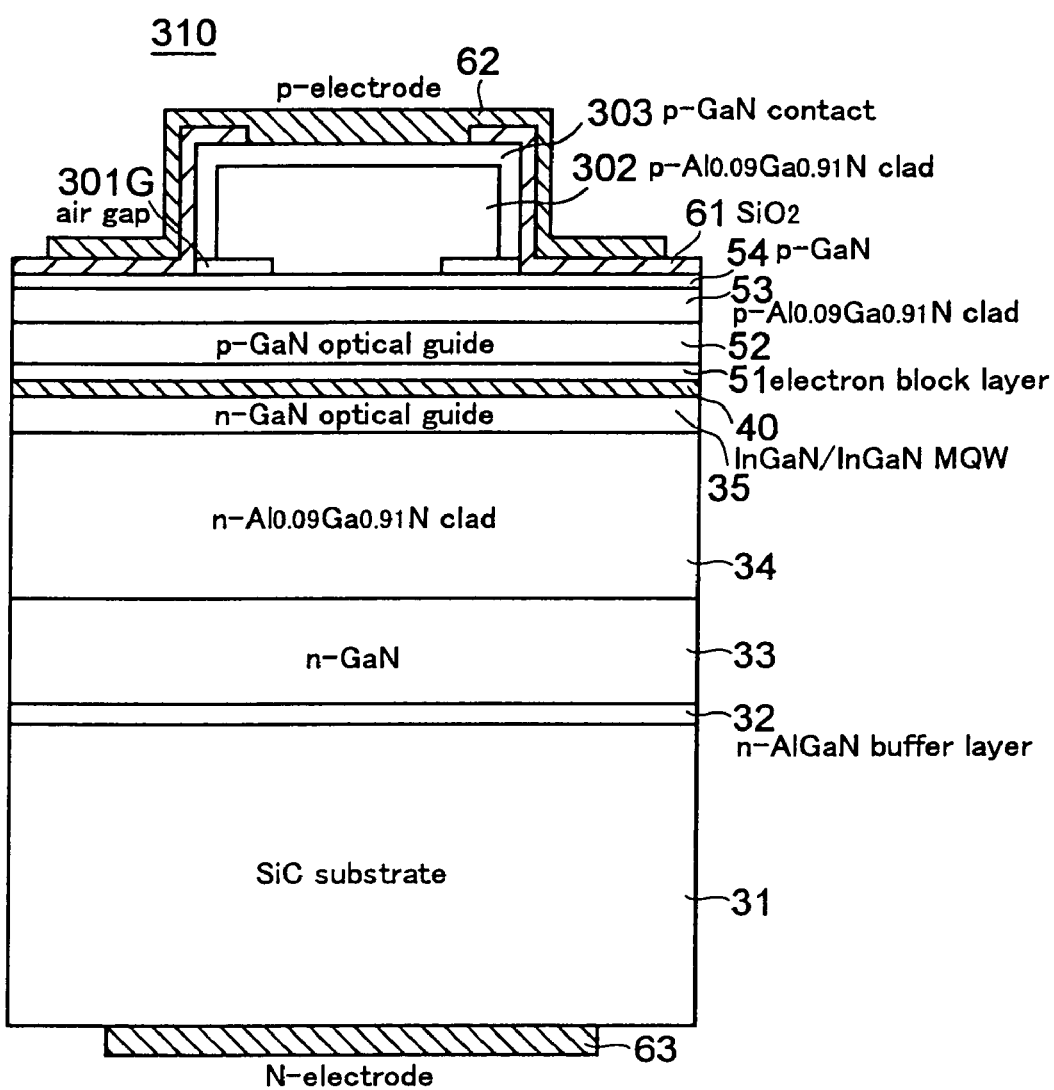
FIG. 11 is a diagram showing a modification of the laser diode of the third embodiment; p

FIG. 11 shows the construction of a laser diode 310 thus formed according to a modification of the present embodiment.

Referring to FIG. 11, the third cladding layer 302 has a T-shaped form having a reduced width at the bottom part thereof similarly to the structure of FIG. 11B, wherein it should be noted that the SiO$_2$ film 301 of FIG. 10B is replaced with an air gap 301G cutting into the cladding layer 302 from both lateral sides thereof at the bottom part of the cladding layer 302. Further, an SiO$_2$ film similar to the SiO$_2$ film 61 is provided so as to cover the top surface and both side walls of the cladding layer 302 wherein the SiO$_2$ film 61 covers the exposed top surface of the contact layer 54. The contact laser 61 is formed with an opening exposing the GaN contact layer 303 covering the top surface of the third cladding layer 302 and the electrode 62 makes an ohmic contact with the exposed top surface of the third cladding layer 302.

Typically, the SiO$_2$ film 61 is formed by a vapor phase deposition process such as a high-temperature CVD process and may penetrate into the air gap 301G. Thereby, the air gap 301G may be filled entirely or partially by SiO$_2$ forming the SiO$_2$ film 61.

In the laser diode 300 or 310 of the present embodiment, it is possible to eliminate the contact layer 303.

[Fourth Embodiment]

Figure 12A:
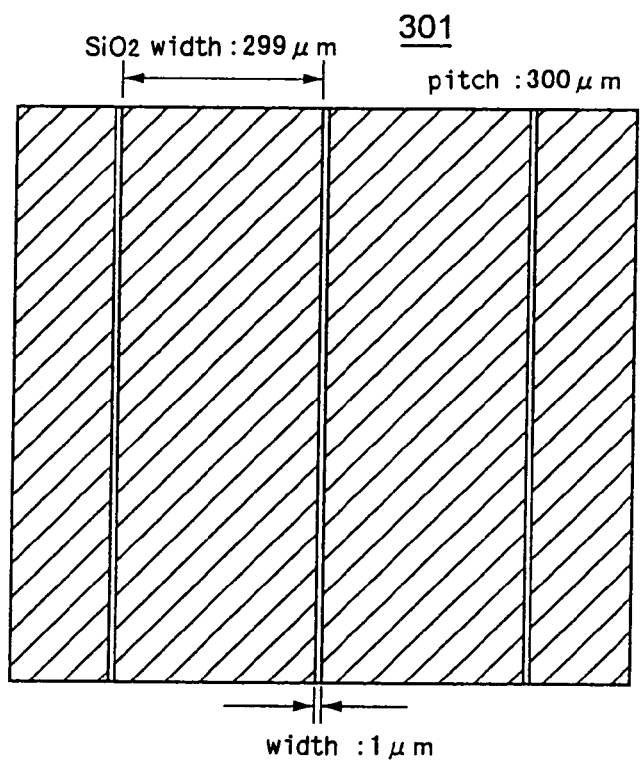
FIGS. 12A and 12B are diagrams showing the construction of a mask used in a selective growth process when fabricating the laser diode of the third embodiment and a laser diode of a fourth embodiment of the present invention.

FIG. 12A is a plan view showing the insulation film 301 used as a mask in the foregoing fabrication process of the laser diode 300 or 310, when forming the cladding layer 302 or 303 by a selective growth process.

Referring to FIG. 12A, the insulation film 301 includes a number of Linearly extending stripe openings each having a width of about 1 μm. The stripe openings are repeated with an interval of about 300 μm, and thus, there is formed a wide area of SiO$_2$ between one stripe opening and an adjacent stripe opening.

Thus, it will be easily understood that there occur an extensive formation of particles on the mask when the insulation film 301 of FIG. 12A is used for the mask during the MOVPE process for forming the third cladding layer 302 or the contact layer 303.

Figure 12B:
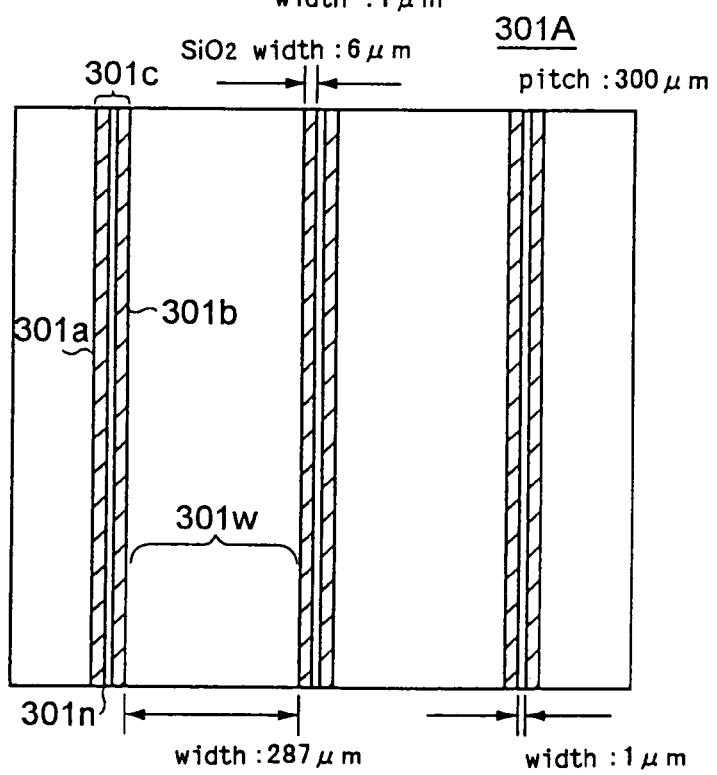

In the present embodiment, the foregoing problem of deposition of particles on the mask is eliminated by using a mask 301A shown in FIG. 12B.

Referring to FIG. 12B, it will be noted that a pair of linearly extending insulation stripes 301a and 301b each having a width of 6 μm are disposed adjacent with each other to form a mask pattern 301c, with a gap 301n of about 1 μm formed between the insulation stripes 301a and 301b forming the mask pattern 301c, wherein the foregoing mask pattern 301c thus formed is repeated a number of times with a pitch of 300 μm. In the mask 301A thus including the repetition of the mask patterns 301c it should be noted that the underlying GaN contact layer 54 is exposed between a mask pattern 301c and an adjacent mask pattern 301c, and the problem of particle formation is effectively eliminated. Instead of forming particles, the source elements supplied during the MOVPE process for forming the p-type AlGaN cladding layer 302 or the p-type GaN contact layer 303 form an epitaxial layer of p-type AlGaN or p-type GaN on the exposed surface of the GaN contact layer 54.

Figure 13:
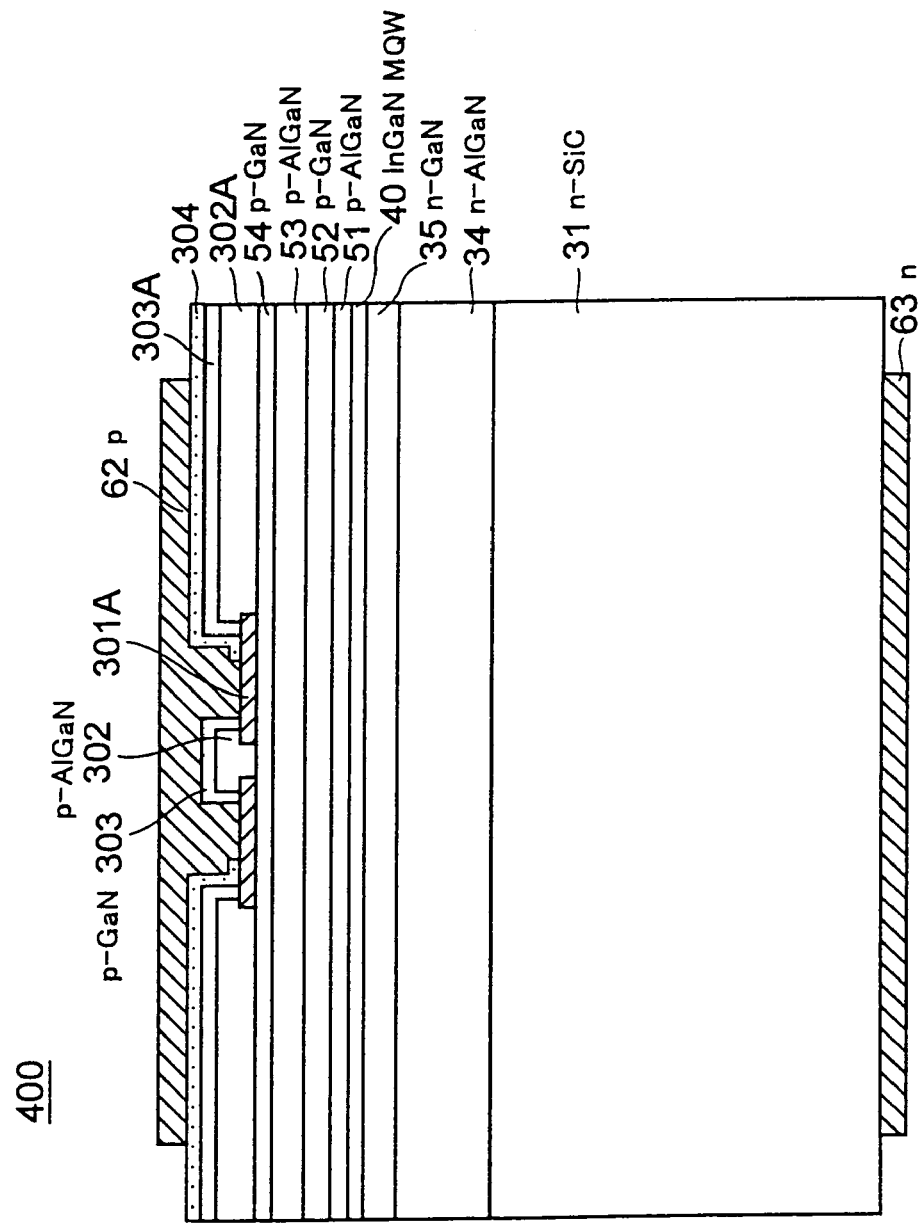
FIG. 13 is a diagram showing the construction of a laser diode according to the fourth embodiment of the present invention.

FIG. 13 shows the construction of a laser diode 400 that uses the mask 301A of FIG. 12B for the selective growth process of the third cladding layer 302 and the contact layer 303 according to a fourth embodiment of the present invention, wherein those parts corresponding to the parts described previously are designated by the same reference numerals and the description thereof will be omitted.

Referring to FIG. 13, the mask 301A is formed on the contact layer 54 of p-type GaN, and the cladding layer 302 of p-type AlGaN and the contact layer 303 of p-type GaN are formed consecutively on the contact layer 54 in correspondence to the stripe-formed gap 301n of the mask pattern 301c, by conducting the MOVPE process while using the mask 301A as a mask. Simultaneously, an epitaxial layer 302A of p-type AlGaN having a composition substantially identical with the composition of the cladding layer 302 is formed outside the mask pattern 301c and another epitaxial layer 303A of p-type GaN having a substantially identical composition with the composition of the contact layer 303 is formed on the epitaxial layer 302A. Thereby, the epitaxial structure including the epitaxial layers 302A and 303A is separated from the structure formed of the third cladding layer 302 and the contact layer 303 by a recess exposing the mask 301A.

It should be noted that the epitaxial layer 303A is covered by another $SiO_2$ film 304, wherein the $SiO_2$ film 304 includes an opening formed in correspondence to the recess part so as to expose the contact layer 303, and an electrode corresponding to the electrode 62 is formed on the $SiO_2$ film 304 so as to fill the foregoing recess. It should be noted that the $SiO_2$ film 304 is formed to have a thickness of about 200 nm by a high-temperature CVD process, and the foregoing opening is formed in the $SiO_2$ film 304 by a wet etching process using HF.

As explained already, the laser diode 400 of the present embodiment minimizes the formation of particles on the mask 301A and the yield of production of the laser diode is improved substantially. As the laser diode 400 of FIG. 13 allows the electrode 62 to have a large area and a substantially flat top surface, mounting process of the laser diode 400 is facilitated substantially.

[Fifth Embodiment]

As explained already, the selective growth process used in the fabrication process of the laser diode 300, 310 or 400 tends to cause the problem of deposition of particles on the insulation mask. This problem of particle formation becomes particularly serious in the process of forming the cladding layer 302 of AlGaN. It should be noted that the AlN component included in the AlGaN cladding layer 301 has a tendency of preferential deposition on an $SiO_2$ film that forms the mask 301, while the AlN component thus deposited tend to act as a nucleus for formation of the AlGaN cladding layer 301.

In the experimental investigation that constitutes the basis of the present inventions the inventor of the present invention has discovered that the formation of particles on an $SiO_2$ mask is effectively suppressed in the selective growth process of AlGaN conducted by an MOVPE process, by supplying the gaseous source of the elements together with a gas containing halogen.

FIGS. 14A–14F explain the foregoing experiments conducted by the inventor of the present invention.

Referring to FIG. 14A, a 6H—SiC substrate 501 is cleaned in an organic solvent and then in water, and the substrate 501 thus processed is then immersed in a bath of HF for about 1 minute.

The substrate 501 thus processed is then introduced into a reaction chamber of an MOVPE apparatus so as to expose a (0001)Si surface thereof on which the deposition of epitaxial layers is to be made. After evacuating the reaction chamber, the native oxide film is removed from the surface of the SiC substrate 501 by processing the substrate 501 at 1080° C. In a hydrogen atmosphere for about 5 minutes. Next, the substrate temperature is reduced to about 1050° C., and an AlGaN film 502 is grown on the foregoing (0001)Si surface of the substrate 501 while supplying TMG, TMA and $NH_3$ with respective flow rates of 44 μmol/min, 8 μmol/min and 0.1 μmol/min, together with a carrier gas of $H_2$. The foregoing source gases are applied directly to the substrate surface and the AlGaN film 502 is grown thereon with a thickness of about 1 μm.

Next, in the step of FIG. 14B, the supply of TMG and TMA is interrupted and the substrate temperature is lowered to 600° C. or lower while continuously directing the $NH_3$ gas to the substrate. Thereby, the atmosphere inside the reaction chamber is changed to $N_2$. After cooling further to the room temperature, the substrate 501 is taken out from he deposition chamber, and an $SiO_2$ film 503 is formed on the foregoing AlGaN film 502 with a thickness of 0.2 μm.

Next, in the step of FIG. 14C, a resist film is formed on the $SiO_2$ film 503, followed by a patterning process to from a resist pattern 504 having a width of 2 μm, such that the resist pattern 504 is repeated with a pitch of 30 μm.

Next, In the step of FIG. 14D, the $SiO_2$ film is subjected to a wet etching process using HF as an etchant to form a line and space pattern exposing the AlGaN film 502. After removing the resist pattern 504 by using an organic solvent, the substrate 501 is returned to the reaction chamber of the MOVPE apparatus. The reaction chamber is then evacuated, and the native oxide film is removed from the exposed part of the AlGaN film 502 by applying a heat treatment process at 1050° C. In $H_2$ atmosphere, while supplying $NH_3$. Further, a selective epitaxial growth of an AlGaN film 505 is made on the exposed surface of the AlGaN film 502 by supplying TMG, TMA, $CH_3Cl$ and $NH_3$ with respective flow rates of 44 μmol/min, 8 μmol/min, 52 μmol/min and 0.1 μmol/min, together with a carrier gas of $H_2$.

In the step of FIG. 14F, the substrate temperature is then lowered to below 600° C. while supplying $NH_3$ to the reaction chamber, such that the atmosphere inside the reaction chamber is changed to the $N_2$ atmosphere. Thereafter, the substrate temperature is lowered to the room temperature.

According to the selective growth process of the present embodiment, the $CH_3Cl$ molecules supplied in the step of FIG. 14F to the reaction chamber together with the gaseous source material release Cl atoms as a result of the pyro-decomposition process thereof, wherein the Cl atoms thus released suppresses the AlN formation on the exposed surface of the AlGaN film 502 by preferentially reacting with Al. The supply of $CH_3Cl$ is preferably made to the reaction chamber by a gas inlet different from the inlet used for introducing a gaseous source of group V element such as $NH_3$. Thereby, the nuclei formation on the $SiO_2$ mask 503 is impeded and the deposition of polycrystalline or particulate precipitates on the mask 503 is suppressed.

It should be noted that the element that suppresses the AlN formation on the $SiO_2$ mask is by no means limited to Cl but other halogen element such as F can be used also for the same purpose. Further, the compound that is used as the carrier of the halogen atom is by no means limited to $CH_3Cl$ but other halogen compounds, including a metal-organic compound containing halogen, may also be used.

It should be noted that the selective epitaxial growth process according to the present embodiment is applicable not only to the fabrication process of a ridge-type laser diode as described but the present embodiment is also applicable to general fabrication process of a semiconductor device that includes a selective growth of a nitride film of a group III element including Al.

[Sixth Embodiment]

In the GaN-family laser diodes 100, 200, 300, 310 and 400 described heretofore, it should be noted that there is formed an electron blocking layer 51 of AlN formed adjacent to the active layer structure 40, wherein the electron blocking layer 51 is doped with Mg to a high concentration level and blocks the electrons that are injected into the active layer structure 40 and subsequently causing an overflow from the active layer structure 40 as a result of the large electric field formed in the p-type epitaxial structure 50. For this purpose, the electron blocking layer 51 is generally formed to have a composition that provides a large bandgap. Thus, the optical waveguide layer 52 of p-type GeN or the cladding layer 53 of p-type AlGaN is formed above the electron blocking layer 51. It should be noted that the p-type AlCaN cladding layer 53 has a relatively large resistivity, and because of this, the foregoing large electric is created.

Figure 15:
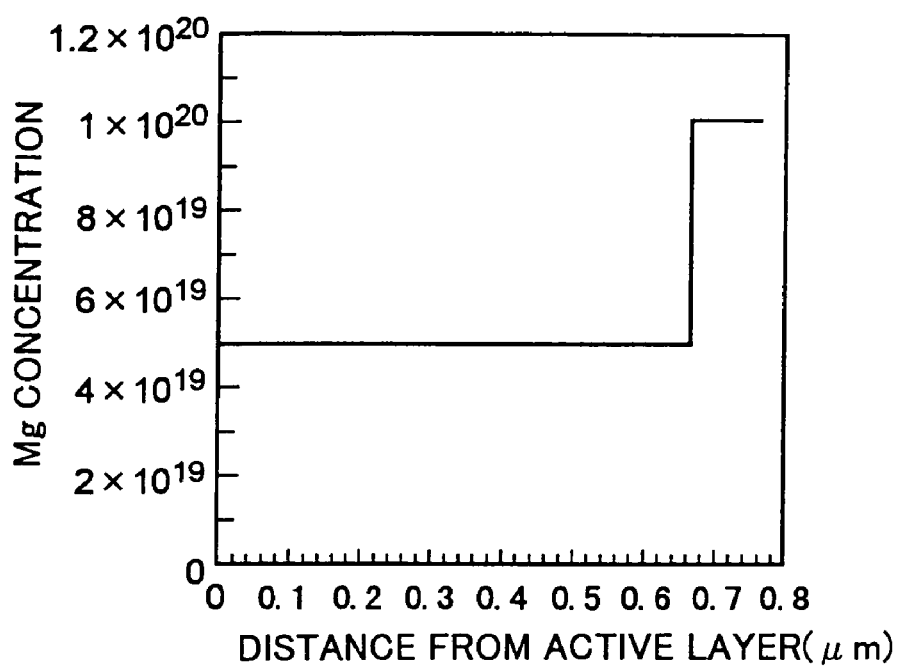
FIG. 15 is a diagram showing a distribution of Mg in a conventional laser diode.

FIG. 15 shows the Mg concentration profile used in the GaN-family laser diode disclosed in the Japanese Laid-Open Patent Publication 10-56236 for the part located above the active layer structure. It should be noted that the GaN-family laser diode of FIG. 15 is formed on a sapphire substrate.

Referring to FIG. 15, the laser diode includes, in addition to the foregoing electron blocking layer, an optical waveguide layer of GaN formed thereon as a part of the SCH structure and a cladding layer of AlGaN, wherein the electron blocking layer, the optical waveguide layer and the cladding layer are all doped with Mg to the concentration level of about $5 \times 10^{19}$ cm$^{-3}$. Only the uppermost contact layer of GaN is doped by Mg to the concentration level of about $1 \times 10^{20}$ cm$^{-3}$. It should be noted that the laser diode 100 of the previous embodiment also uses the Mg profile of FIG. 15.

On the other hand, the Mg concentration profile of FIG. 15 cannot avoid cracking in the epitaxial layers used in nitride laser diodes. Such cracks formed in the epitaxial layers provides undesirable effect of decreased efficiency of laser oscillation and increased threshold voltage. Thus, it is desirable to reduce the crack formation as much as possible.

In the experimental investigation on the laser diode 100 described previously, the inventor of the present invention has discovered that the cracks formed in the epitaxial layers of the laser diode is reduced substantially when the Mg concentration level is reduced in the p-type GaN optical waveguide layer 52 and the p-type AlGaN cladding layer 53, all located above the active layer structure 40.

Figure 16:
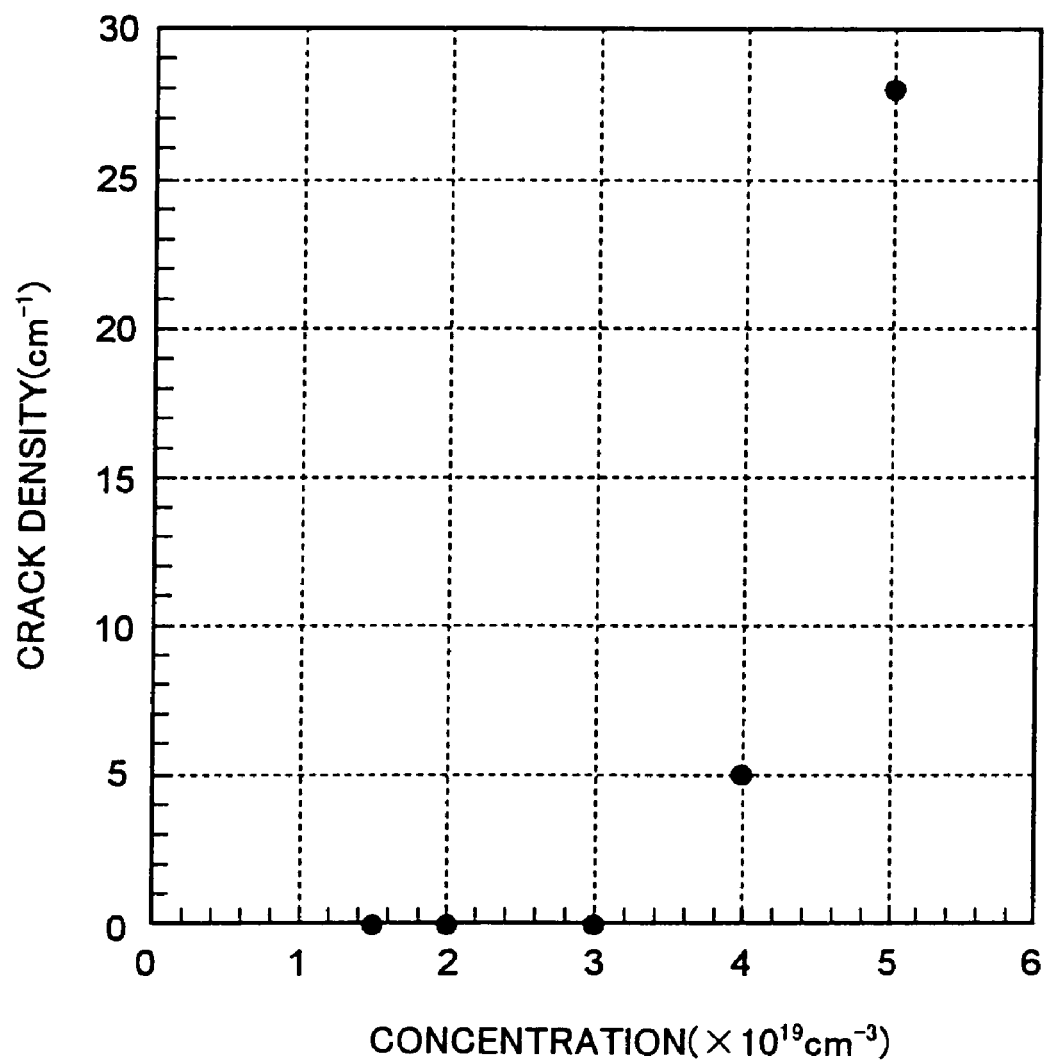
FIG. 16 is a diagram showing the experiments constituting one of the basis of the present invention.

Referring to FIG. 16, it can be seen that the crack density observed on the surface of the cladding layer 53 is reduced sharply when the Mg concentration level in the GaN optical waveguide layer 52 and the AlGaN cladding layer 53 is reduced below the conventionally used value of $5 \times 10^{19}$ cm$^{-3}$. When the Mg concentration level is reduced below about $4 \times 10^{19}$ cm$^{6-3}$, particularly below than about $3 \times 10^{19}$ cm$^{-3}$, it can be seen that the observed crack density becomes substantially zero. In FIG. 16, it should be noted that the vertical axis represents the crack density while the horizontal axis represents the Mg concentration level.

Figure 17:
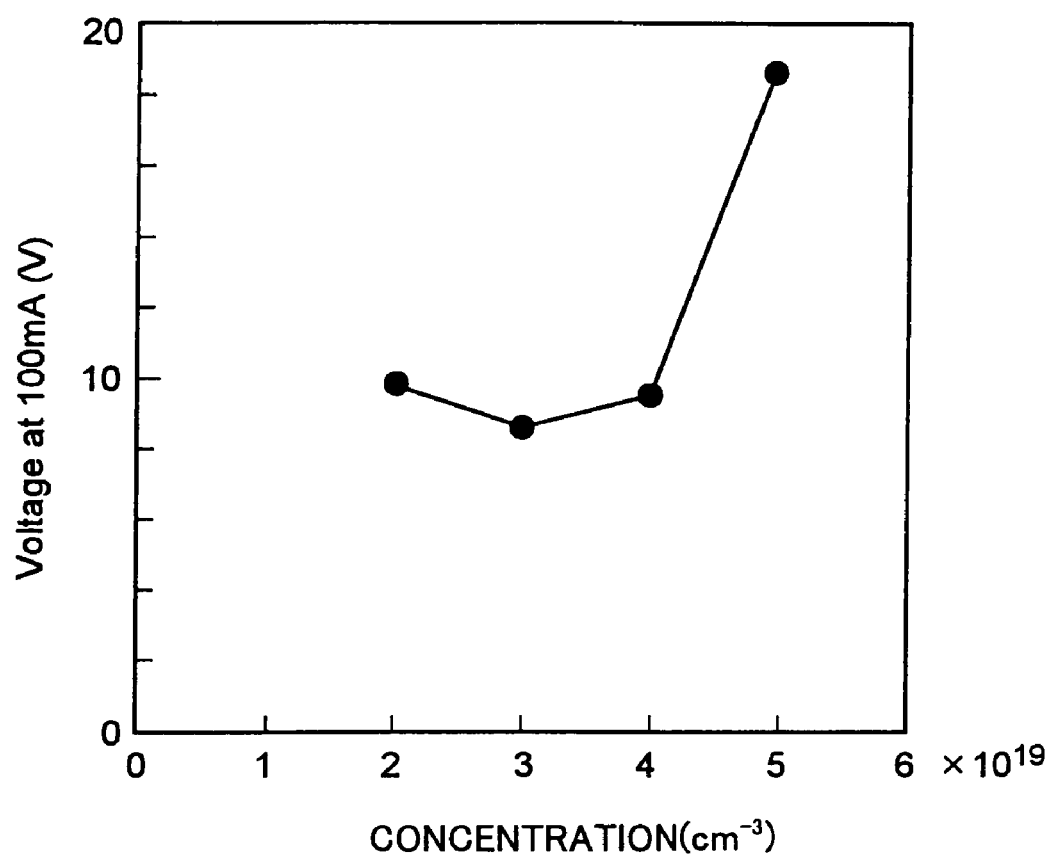
FIG. 17 is a diagram showing the experiments constituting one of the basis of the present invention.

In conformity with the crack density, the resistance of the laser diode 100 is reduced sharply when the Mg concentration level in the optical waveguide layer 52 and the cladding layer 53 is reduced. Thereby, a minimum resistance is reached when the optical waveguide layer 52 and the cladding layer 53 have the Mg concentration level of $3-4 \times 10^{19}$ cm$^{-3}$ as represented in FIG. 17, wherein FIG. 17 shows the Mg concentration level in the horizontal axis and the drive voltage necessary for flowing a drive current of 100 mA in the vertical axis. With further decrease in the Mg content, it can be seen that the resistance of the laser diode 100 starts to increase again, while this effect is merely attributed to the depletion of carries in the optical waveguide layer 52 and in the cladding layer 53 due to the excessively reduced concentration level of Mg.

Figure 18:
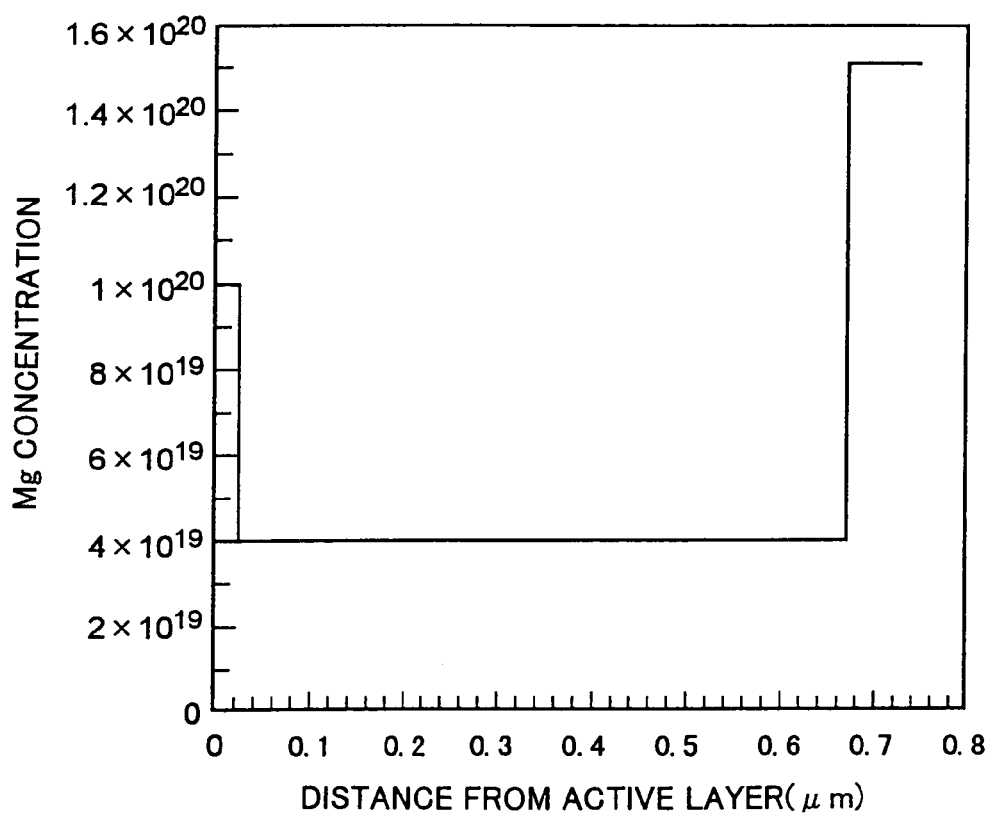
FIG. 18 is a diagram showing a Mg distribution used in a laser diode according to a sixth embodiment of the present invention.

FIG. 18 shows the doping profile of Mg for the laser diode 100 of FIGS. 6A and 6B optimized in view of the discovery of the relationship of FIG. 17.

Referring to FIG. 18, the electron blocking layer 51 of p-type AlGaN has a composition of $Al_{0.18}Ga_{0.82}N$ and is formed on the active layer structure 40 with a thickness of about 20 nm, wherein the electron blocking layer 51 is doped with Mg to the concentration level of about $1 \times 10^{20}$ cm$^{-3}$. On the electron blocking layer 51, the optical waveguide layer 52 of p-type GaN is formed with a thickness of about 100 nm, wherein the optical waveguide layer 52 is doped with Mg to the concentration level of about $4 \times 10^{19}$ cm$^{-3}$. Further, the cladding layer 53 of p-type AlGaN has a composition of $Al_{0.09}GA_{0.91}N$ as noted before wherein the cladding layer 53 is formed on the optical waveguide layer 52 with a thickness of about 550 nm. The cladding layer 53 is also doped with Mg to the concentration level of about $4 \times 10^{19}$ cm$^3$.

On the cladding layer 53, the contact layer 54 of p-type GaN is formed with a thickness of about 80 nm. wherein the contact layer 53 is doped with Mg to the concentration level of about $1.5 \times 10^{20}$ cm$^{-3}$.

According to the present invention, the crack density in the optical waveguide layer 52 and the cladding layer 53 is minimized by setting the Mg concentration level in the layers 52 and 53 to be about $4 \times 10^{19}$ cm$^{-3}$ or less. Thereby, the resistance of the laser diode is minimized. Further, the threshold voltage of the laser diode is decreased by increasing the Mg concentration level in the electron blocking layer 51 above the foregoing value of about $4 \times 10^{19}$ cm$^{-3}$. Further, the increase of the laser diode resistance as a result of the excessively low impurity concentration level is also avoided.

Figure 19:
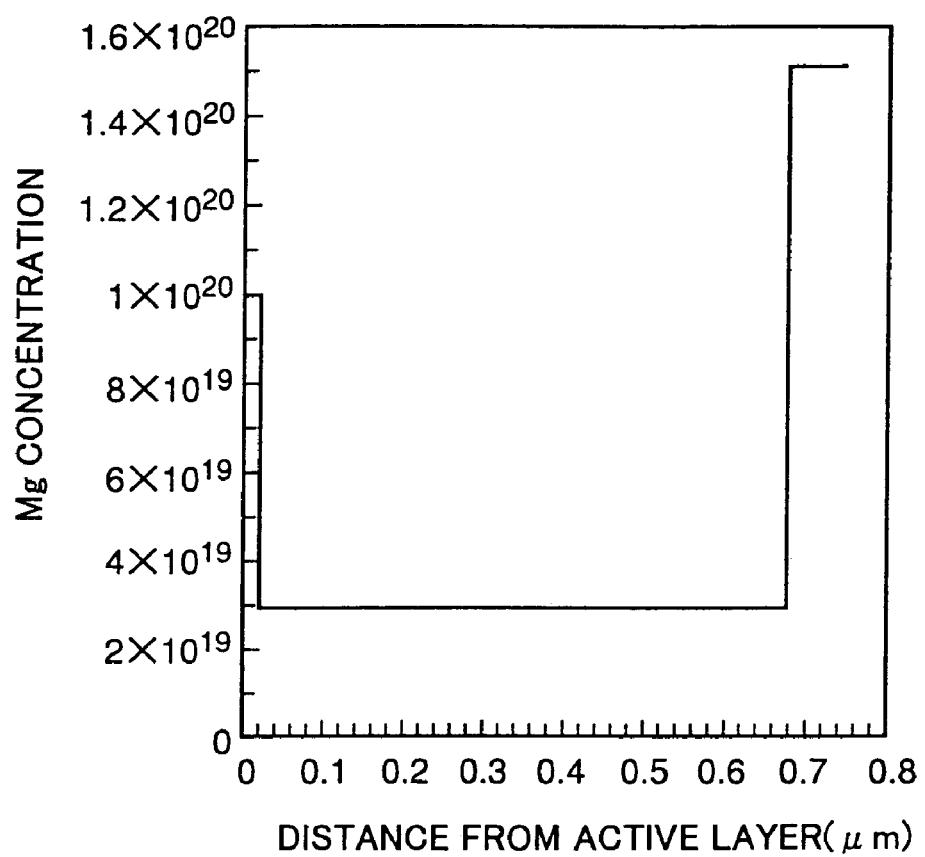
FIG. 19 is a diagram showing a Mg distribution according to a modification of the sixth embodiment.

FIG. 19 shows a modification of the embodiment of FIG. 18 in which the Mg concentration level in the optical waveguide layer 52 and the cladding layer 53 is decreased to about $3 \times 10^{19}$ cm$^{-3}$ in view of the relationship of FIG. 17. In the case of FIG. 19, too, the crack density in the epitaxial layers constituting the laser diode 100 is reduced to substantially zero by combining the electron blocking layer 51 and the contact layer 54, which are doped to a high concentration level. Thereby, the crack density, and hence the resistance, in the epitaxial layers is successfully minimized.

Further, the present invention is not limited to the embodiments described heretofore, but various variations and modifications may be made without departing from the scope of the invention.

The present application is based on Japanese priority applications No. 10-135425 and 10-353241 filed respectively on May 18, 1998 and Dec. 11, 1998, the entire contents of which are hereby incorporated by reference.

What is claimed is:

1. An optical semiconductor device, comprising:
a substrate of SiC having a first conductivity type;
a buffer layer of AlGaN formed on said substrate epitaxially, said buffer layer having said first conductivity type and a composition represented by a compositional parameter x as $Al_xGa_{1-x}N$;
a first cladding layer having said first conductivity type, said first cladding layer being formed on said buffer layer epitaxially;
an active layer formed epitaxially on said first cladding layer;
a second cladding layer having a second, opposite conductivity type, said second cladding layer being formed on said active layer epitaxially;
a first electrode provided so as to inject first-type carriers having a first polarity into said second cladding layer; and
a second electrode provided on a bottom surface of said substrate so as to inject second-type carriers having a second polarity,
said buffer layer containing said second type carriers with a concentration level in the range from $3 \times 10^{18}$ cm$^{-3}$ to $1 \times 10^{20}$ cm$^{-3}$ and said compositional parameter x larger than 0 but smaller than 0 4 (0<x<0 4) so as to reduce an interface resistance between said substrate and said buffer layer.

2. An optical semiconductor device as claimed in claim 1, wherein said substrate contains carriers of said first conductivity type with a concentration level in the range from $1 \times 10^{18}$–$1 \times 10^{20}$ cm$^{-3}$.

3. An optical semiconductor device as claimed in claim 1, wherein said compositional parameter x of said buffer layer is less than 0.09 (x<0.09).

4. An optical semiconductor device as claimed in claim 1, wherein said substrate has a (0001)Si surface of SiC and wherein said buffer layer is formed on said (0001)Si surface in intimate contact with said substrate.

5. A method of fabricating an optical semiconductor device, comprising the step of: growing an AlGaN film having a composition of $Al_xGa_{1-x}N$ (0<x<0.4) on an SiC substrate by a metal-organic vapor phase epitaxy process, under a pressure of about 90 Torr or less.

6. An optical semiconductor device, comprising:
a substrate of SiC having a first conductivity type;
a buffer layer of AlGaN formed on said substrate epitaxially;
a first cladding layer of AlGaN having said first conductivity type, said first cladding layer being formed on said buffer layer epitaxially;
an optical waveguide layer of GaN having said first conductivity type, said optical waveguide layer being formed on said first cladding layer epitaxially;
an active layer formed epitaxially on said optical waveguide layer, said active layer containing Ga as a group III element and N as a group V element;
a second cladding layer of AlGaN having a second, opposite conductivity type, said second cladding layer being formed on said active layer epitaxially;
a first electrode provided so as to inject first-type carriers having a first polarity into said second cladding layer; and
a second electrode provided on said substrate so as to inject second-type carriers having a second polarity,
said substrate having a top surface separated from a bottom surface of said active layer by a distance of about 1.6 μm or more.

7. An optical semiconductor device as claimed in claim 6, wherein said buffer layer has a composition represented by a compositional parameter x as $Al_xGa_{1-x}N$, said first cladding layer has a composition represented by a compositional parameter y as $Al_yGa_{1-y}N$, and said second cladding layer has a composition represented by a compositional parameter z as $Al_zGa_{1-z}N$, said compositional parameter x having a value equal to or larger than 0.08 but smaller then 0.5 ($0.08 \leq x < 0.5$), said compositional parameter y having a value equal to or larger than 0.05 but equal to or smaller than said compositional parameter x ($0.05 \leq y \leq x$), said compositional parameter z having a value smaller than said compositional parameter y (z<y).

8. An optical semiconductor device, comprising:
a substrate of SiC having a first conductivity type;
a first cladding layer having a first conductivity type, said first cladding layer being formed on said substrate epitaxially;
an active layer formed epitaxially on said first cladding layer;
a second cladding layer having a second, opposite conductivity type, said second cladding layer being formed on said active layer epitaxially;
a third cladding layer having said second conductivity type, said third cladding layer being formed on said second cladding layer epitaxially;
a first electrode provided so as to inject first-type carriers having a first polarity into said second cladding layer; and
a second electrode provided on said substrate so as to inject second-type carriers having a second polarity,
said third cladding layer having a ridge structure,
wherein an insulating film is interposed between said second cladding layer and said third cladding layer, said insulating film having an opening in correspondence to said ridge structure, with a width smaller than a width of said ridge structure.

9. An optical semiconductor device as claimed in claim 8, wherein a contact layer covers a top surface and both side walls of said ridge structure continuously.

10. An optical semiconductor device as claimed in claim 9, wherein said first electrode covers a top surface and both side walls of said contact layer, corresponding respectively to said top surface and both side walls of said ridge structure, continuously.

11. An optical semiconductor device as claimed in claim 10, wherein said ridge structure is formed in a recess structure exposing said insulation film, and wherein said first electrode fills said recess structure.

12. An optical semiconductor device as claimed in claim 10 wherein said third cladding layer is formed of a nitride of a group III element.

13. An optical semiconductor device, comprising:
a substrate of SiC having a first conductivity type;
a first cladding layer having a first conductivity type, said first cladding layer being formed on said substrate epitaxially;
an active layer formed epitaxially on said first cladding layer;
a second cladding layer having a second, opposite conductivity type, said second cladding layer being formed on said active layer epitaxially;
a third cladding layer having said second conductivity type, said third cladding layer being formed on said second cladding layer epitaxially;
a contact layer of said second conductivity type, said contact layer being formed on said third cladding layer;
a first electrode provided on said contact layer;
a second electrode provided on said substrate;
said third cladding layer forming a ridge structure having a T-shaped cross-section,
said third cladding layer including, at a bottom part thereof, a pair of cuts such that said cuts penetrate from respective lateral sides of said ridge structure toward a center of said ridge structure.

14. A method of fabricating a semiconductor device, comprising the steps of:
forming an insulation pattern on a semiconductor layer such that said insulation pattern has an opening; and
forming, on said insulation pattern, a regrowth region of a nitride of Al and a group III element in correspondence to said opening,
said step of forming the regrowth region being conducted by an metal-organic vapor phase epitaxy process.

15. A method as claimed in claim 14, wherein said step of forming said regrowth region includes the step of admixing a halogen to a source material used in said metal-organic vapor phase epitaxy process for forming said nitride.

16. A method as claimed in claim 15, wherein said step of forming said regrowth region includes the step of supplying said halogen to a reaction chamber of a metal-organic vapor phase deposition apparatus, in which said metal-organic vapor phase epitaxy process occurs, separately to a gaseous source of nitrogen.

17. A method as claimed in claim 14, wherein said step of forming said regrowth region is conducted by using a metal organic compound containing halogen.

18. An optical semiconductor device, comprising;
a substrate;
a first cladding layer of a nitride of a group III element formed epitaxially on said substrate, said first cladding layer having an n-type conductivity;
a first optical waveguide layer of a nitride of a group III element formed epitaxially on said first cladding layer, said first optical waveguide layer having an n-type conductivity;
an active layer of a nitride of a group III element formed epitaxially on said first optical waveguide layer;
an electron blocking layer of a nitride of a group III element formed epitaxially on said active layer, said electron blocking layer having a p-type conductivity;
a second optical waveguide layer of a nitride of a group III element formed epitaxially on said electron blocking layer, said second optical waveguide layer having a p-type conductivity;
a second cladding layer of a nitride of a group III element formed epitaxially on said second optical waveguide layer, said second cladding layer having a p-type conductivity;
a contact layer of a nitride of a group III element formed epitaxially on said second cladding layer, said contact layer having a p-type conductivity;
a first electrode provided on said contact layer; and
a second electrode provided on said substrate;
each of said electron blocking layer, said second optical waveguide layer and said second cladding layer being doped by Mg;
wherein said second optical waveguide layer and said second cladding layer contain Mg therein with a concentration level lower than a concentration level of Mg in any of said electron blocking layer and said contact layer.

19. An optical semiconductor device as claimed in claim 18, wherein said second optical waveguide layer and said second cladding layer contain Mg with a concentration level not exceeding $4\times10^{19}$ cm$^{-3}$.

20. An optical semiconductor device as claimed in claim 19, wherein said electron blocking layer and said contact layer contain Mg with a concentration level exceeding $4\times10^{19}$ cm$^{-3}$.

21. A semiconductor wafer, comprising:
an SiC substrate having an n-type conductivity; and
an AlGaN layer having an n-type conductivity formed on said SiC substrate with a composition represented as $AlGa_{1-x}N$,
wherein said AlGaN layer has a carrier density in the range between $3\times10^{18}$–$1\times10^{20}$ cm$^{-3}$, and
wherein said composition parameter x is larger than 0 but smaller than 0.4 ($0<x<0.4$) so as to reduce an interface resistance between said SiC substrate and said AlGaN layer.

22. A semiconductor wafer as claimed in claim 21, wherein said substrate contains carriers of said first conductivity type with a concentration level in the range from $1\times10^{18}$–$1\times10^{20}$ cm$^{-3}$.

23. A semiconductor wafer as claimed in claim 21, wherein said compositional parameter x of said buffer layer is less than 0.09 ($x<0.09$).

24. An optical semiconductor device as claimed in claim 21, wherein said substrate has a (0001)Si surface of SiC and wherein said buffer layer is formed on said (0001)Si surface in intimate contact with said substrate.

* * * * *